(12) United States Patent
Goto et al.

(10) Patent No.: US 12,209,722 B2
(45) Date of Patent: Jan. 28, 2025

(54) VEHICLE LIGHT-EMITTING DEVICE AND VEHICLE LIGHTING DEVICE

(71) Applicant: NICHIA CORPORATION, Anan (JP)

(72) Inventors: Yuya Goto, Tokushima (JP); Koji Kajikawa, Tokushima (JP); Yuji Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 6 days.

(21) Appl. No.: 18/467,677

(22) Filed: Sep. 14, 2023

(65) Prior Publication Data

US 2024/0093846 A1 Mar. 21, 2024

(30) Foreign Application Priority Data

Sep. 15, 2022 (JP) ................................ 2022-147164
Aug. 22, 2023 (JP) ................................ 2023-134631

(51) Int. Cl.
*F21S 41/176* (2018.01)

(52) U.S. Cl.
CPC .................................. *F21S 41/176* (2018.01)

(58) Field of Classification Search
CPC ..... B60Q 1/2607; C09K 11/77342–774; F21S 41/176; F21S 43/14–16; F21S 43/255; H01L 33/502–504
See application file for complete search history.

(56) References Cited

U.S. PATENT DOCUMENTS

| 8,530,250 | B2 | 9/2013 | Ichikawa et al. |
| 9,287,476 | B2 | 3/2016 | Ichikawa et al. |
| 9,490,411 | B2 | 11/2016 | Ichikawa et al. |
| 9,537,071 | B2 | 1/2017 | Ichikawa et al. |
| 10,115,870 | B2 | 10/2018 | Ichikawa et al. |
| 10,573,788 | B2 | 2/2020 | Ichikawa et al. |
| 10,573,789 | B2 | 2/2020 | Ichikawa et al. |
| 10,700,241 | B2 | 6/2020 | Ichikawa et al. |
| 11,085,605 | B2 | 8/2021 | Iwakura |
| 11,094,854 | B2 | 8/2021 | Ichikawa et al. |
| 11,476,395 | B2 | 10/2022 | Mashiko et al. |
| 11,692,683 | B2 | 7/2023 | Iwakura |
| 2011/0210354 | A1 | 9/2011 | Ichikawa et al. |
| 2014/0084320 | A1 | 3/2014 | Ichikawa et al. |
| 2016/0049566 | A1 | 2/2016 | Ichikawa et al. |
| 2016/0056357 | A1 | 2/2016 | Ichikawa et al. |
| 2017/0141273 | A1 | 5/2017 | Ichikawa et al. |

(Continued)

FOREIGN PATENT DOCUMENTS

| JP | 2002133915 A | 5/2002 |
| JP | 2004241348 A | 8/2004 |

(Continued)

*Primary Examiner* — Jason M Han
(74) *Attorney, Agent, or Firm* — Hunton Andrews Kurth LLP

(57) ABSTRACT

The vehicle light-emitting device includes a light-emitting element having a peak emission wavelength of 400 nm or greater and 510 nm or less, and a fluorescent member including a first phosphor excited by light emitted by the light-emitting element and emitting light having a peak emission wavelength of 480 nm or greater and 530 nm or less a second phosphor excited by the light emitted by the light-emitting element and emitting light having a peak emission wavelength of 540 nm or greater and 600 nm or less. The vehicle light-emitting device emits light in a region AL in a CIE1931 chromaticity diagram as defined in the present disclosure.

12 Claims, 19 Drawing Sheets

(56) References Cited

U.S. PATENT DOCUMENTS

| | | |
|---|---|---|
| 2018/0301600 A1 | 10/2018 | Ichikawa et al. |
| 2019/0035981 A1 | 1/2019 | Ichikawa et al. |
| 2019/0088825 A1 | 3/2019 | Ichikawa et al. |
| 2019/0234581 A1 | 8/2019 | Iwakura |
| 2020/0287096 A1 | 9/2020 | Ichikawa et al. |
| 2021/0332965 A1 | 10/2021 | Iwakura |
| 2021/0336094 A1 | 10/2021 | Ichikawa et al. |
| 2021/0367115 A1 | 11/2021 | Mashiko et al. |
| 2022/0242305 A1 | 8/2022 | Hsieh et al. |
| 2023/0109952 A1 | 4/2023 | Iwasa et al. |

FOREIGN PATENT DOCUMENTS

| | | |
|---|---|---|
| JP | 2010062272 A | 3/2010 |
| JP | 2019125577 A | 7/2019 |
| JP | 2019133794 A | 8/2019 |
| JP | 2021158275 A | 10/2021 |
| WO | 2021256307 A1 | 12/2021 | xW AFTER PASSAGE THROUGH COLOR FILTER

VEHICLE LIGHT-EMITTING DEVICE AND VEHICLE LIGHTING DEVICE

CROSS REFERENCE TO RELATED APPLICATIONS

This application claims priority to Japanese Patent Application No. 2022-147164, filed on Sep. 15, 2022, and Japanese Patent Application No. 2023-134631, filed on Aug. 22, 2023, the entire disclosures of which are hereby incorporated herein by reference.

BACKGROUND

The present disclosure relates to a vehicle light-emitting device and a vehicle lighting device.

A vehicle is obliged to be provided with, on a rear surface of a vehicle body, a brake light (stop lamp, brake lamp), a direction indicator (turn signal lamp, blinker), a taillight (tail lamp), a backing light (back lamp), and a rear reflector (reflex reflector), and standards for colors, brightness, and the like of lamplight and reflected light are defined for each of them. These various lamps are combined into one unit and attached to the vehicle body for left and right rear combination lamps, which are a pair. As a general rear combination lamp, a vehicle lighting device is used which emits light of two or three colors, that is, red for both a brake light and a taillight and at least one of amber (orange) for a direction indicator and white for a backing light, in respective divided regions. A rear combination lamp may also be designed in a unique design as a decoration of a vehicle, depending on combination of colors of light or a shape the lamp.

In such a vehicle lighting device, a light-emitting device including a light-emitting diode (LED) or the like is accommodated as a light source in a base member (housing) provided with a reflective film on an inner surface thereof, and an opening of the base member is covered with a cover (outer lens) in a plate shape made of a transparent resin or the like to provide a light irradiation surface. Being provided with a rear reflector that reflects red light, the lighting device includes a red cover made of a transparent resin or the like colored in red with a pigment as a cover of a region of a red lamp and a transparent (clear) cover for forming a region of a white lamp in combination with a light-emitting device that emits white light, or further includes an orange cover in the region of an orange lamp. Accordingly, as the cover of the lighting device, plates of two colors of transparent and red, or three colors of transparent, red, and orange are used and are individually mounted on the base member, or a single color-coded plate formed by integrally molding a resin material is used. When the cover covering a surface is made of two or more types of plates, the shapes of parts constituting the cover may be complicated and the number of parts may increase depending on design, and a mold for forming the cover may also have a complicated shape, which makes it difficult to form the cover. When different functions are provided to portions of the cover, for example, when the cover is mounted on a vehicle, the degree of freedom in design may be limited.

Japanese Patent Publication No. 2002-133915 A discloses a lighting device for a vehicle, including three organic EL display device light sources that emit light of amber (orange), red, and white colors, for example, and covered with a lens cover provided with a lens portion that transmits light from the organic EL display device light sources and a retroreflective portion that is partially colored in a color different from the color of the lens portion.

SUMMARY

One aspect of the present disclosure has an object to provide a vehicle light-emitting device that allows for obtaining prescribed white light after passage through a color filter and reducing a decrease in luminous flux after passage through the color filter, and a vehicle lighting device provided with a cover including one color filter that can cover an entire irradiation surface, and having a high degree of freedom in design.

According to a first aspect of the present disclosure, a vehicle light-emitting device includes a light-emitting element having a peak emission wavelength of 400 nm or greater and 510 nm or less; and a fluorescent member containing a first phosphor adapted to be excited by light emitted by the light-emitting element and emit light having a peak emission wavelength in a range of 480 nm to 530 nm and a second phosphor adapted to be excited by the light emitted by the light-emitting element and emit light having a peak emission wavelength of 540 nm or greater and 600 nm or less, wherein the vehicle light-emitting device is configured to emit light having chromaticity existing in a region AL in a CIE 1931 chromaticity diagram in which chromaticity is defined by x and y coordinates, the region AL defined by a first L straight line connecting a first L point at first chromaticity coordinates (xL=0.278, yL=0.332) and a second L point at second chromaticity coordinates (xL=0.468, yL=0.458), a second L straight line connecting the second L point and a third L point at third chromaticity coordinates (xL=0.426, yL=0.498), a third L straight line connecting the third L point and a fourth L point at fourth chromaticity coordinates (xL=0.247, yL=0.362), and a fourth L straight line connecting the fourth L point and the first L point.

According to a second aspect, a vehicle lighting device includes the vehicle light-emitting device; and a color filter at a position on which light emitted by the vehicle light-emitting device is incident, wherein a maximum transmittance of the color filter for light in a range of 410 nm to 480 nm is more than 50% and 90% or less, a minimum transmittance of the color filter for light in a range of 500 nm to 550 nm is more than 20% and 70% or less, and a transmittance of the color filter for light in a range of 600 nm to 730 nm is 80% or more, and wherein the vehicle lighting device is configured such that the light emitted by the vehicle light-emitting device passes through the color filter to emit white light.

According to a third aspect, a vehicle lighting device includes the vehicle light-emitting device; and a color filter configured to transmit light emitted by the vehicle light-emitting device to emit white light, wherein in a graph Gx in which a horizontal axis represents a minimum transmittance T (%) of the color filter for light in the range of 500 nm to 550 nm and a vertical axis represents Δx, wherein Δx is a difference obtained by subtracting an xL value, which is an x-coordinate of the chromaticity coordinates of the light emitted by the vehicle light-emitting device before passage through the color filter in the CIE1931 chromaticity diagram, from an xW value, which is an x-coordinate of the chromaticity coordinates of the white light after passage through the color filter in the CIE1931 chromaticity diagram, Δx satisfies Formula (Ix) below, and in a graph Gy in which a horizontal axis represents the minimum transmittance T of the color filter for the light in the range of 500 nm to 550 nm and a vertical axis represents $\Delta y$, wherein $\Delta y$ is a difference obtained by subtracting an yL value, which is an y-coordinate of the chromaticity coordinates of the light emitted by the vehicle light-emitting device before passage through the color filter in the CIE1931 chromaticity diagram, from an yW value, which is an y-coordinate of the chromaticity coordinates of the white light after passage through the color filter in the CIE1931 chromaticity diagram, $\Delta y$ satisfies Formula (Iy) below, $$\Delta x = S^1 \times T + I^1 \quad \text{(Ix)}$$

wherein $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively, $$\Delta y = S^2 \times T + I^2 \quad \text{(Iy)}$$

wherein $S^2$ represents a slope, $I^2$ represents an intercept, and $S^2$, $I^2$, and T satisfy $0 \leq S^2 \leq 0.002$, $-0.114 \leq I^2 \leq -0.030$, and $20 < T \leq 70$, respectively.

According to one aspect of the present disclosure, it is possible to provide a vehicle light-emitting device that allows for obtaining prescribed white light after passage through a color filter and reducing a decrease in luminous flux after passage through the color filter, and a vehicle lighting device including a cover formed of one color filter that can cover an entire irradiation surface and having a high degree of freedom in design.

DETAILED DESCRIPTION

Certain embodiments of the present disclosure will be described below with reference to the drawings. The embodiments described below exemplify a vehicle light-emitting device and a vehicle lighting device for embodying the technical concept of the present disclosure, and the present disclosure is not limited to the vehicle light-emitting device and the vehicle lighting device described below. Members presented in the claims are not in any way limited to members of the embodiment. In particular, dimensions, materials, shapes, relative arrangements, or the like of components described in the embodiment are not intended to limit the scope of the present disclosure thereto, unless otherwise specified, and are merely exemplary. Note that the relationship between color names and chromaticity coordinates, the relationship between the wavelength range of light and the color name of monochromatic light, and the like conform to JIS Z8110. As for a case in which a composite contains a plurality of substances that correspond to a component in a corresponding composite described in the present specification, the content of the component in the composite in the present specification means the total amount of the plurality of substances present in the composite, unless otherwise specified. In the present specification, a full width at half maximum refers to a wavelength width at which an emission intensity is 50% of an emission intensity at a peak emission wavelength exhibiting a maximum emission intensity in an emission spectrum. Members illustrated in the following drawings may be exaggerated in size and positional relationship and may be simplified in shape. In the following description, the same names and reference signs generally denote the same or similar members.

Figure 1:
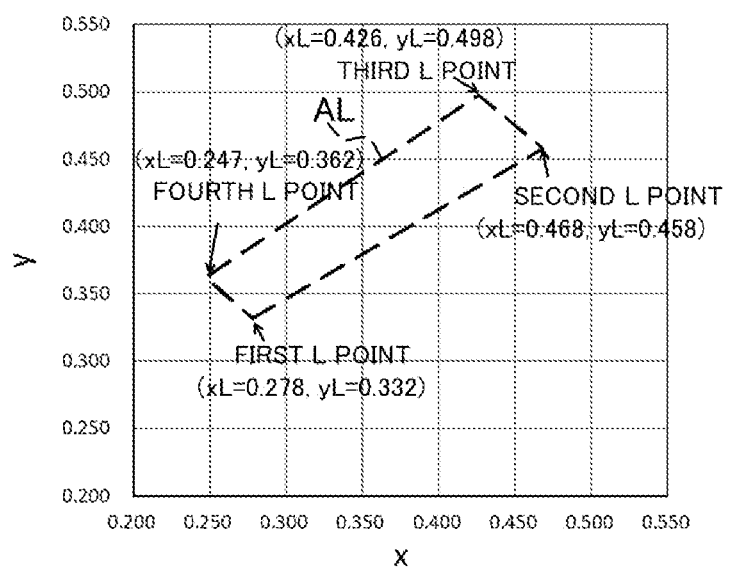
FIG. 1 shows a region AL of an emission color of a vehicle light-emitting device in a CIE1931 chromaticity diagram.

The vehicle light-emitting device includes a light-emitting element having a peak emission wavelength of 400 nm or greater and 510 nm or less; and a fluorescent member containing a first phosphor that is excited by light emitted by the light-emitting element and emits light having a peak emission wavelength of 480 nm or greater and 530 nm or less and a second phosphor that is excited by the light emitted by the light-emitting element and emits light having a peak emission wavelength of 540 nm or greater and 600 nm or less. The vehicle light-emitting device is configured to emit light having chromaticity existing in a region AL in a CIE 1931 chromaticity diagram in which chromaticity is defined by x and y coordinates, the region AL defined by a first L straight line connecting a first L point at chromaticity coordinates (xL, yL) of (xL=0.278, yL=0.332) and a second L point at (xL=0.468, yL=0.458), a second L straight line connecting the second L point and a third L point at (xL=0.426, yL=0.498), a third L straight line connecting the third L point and a fourth L point at (xL=0.247, yL=0.362), and a fourth L straight line connecting the fourth L point and the first L point. FIG. 1 shows the region AL of the xy chromaticity coordinates of light emitted by the vehicle light-emitting device in the CIE1931 chromaticity diagram. Hereinafter, the "CIE1931 chromaticity diagram" may be referred to as "chromaticity diagram" and the "chromaticity coordinates of the CIE1931 chromaticity diagram" may be referred to as "chromaticity coordinates". Light in the region AL in the chromaticity diagram exhibits a whitish bluish-green emission color.

Figure 2:
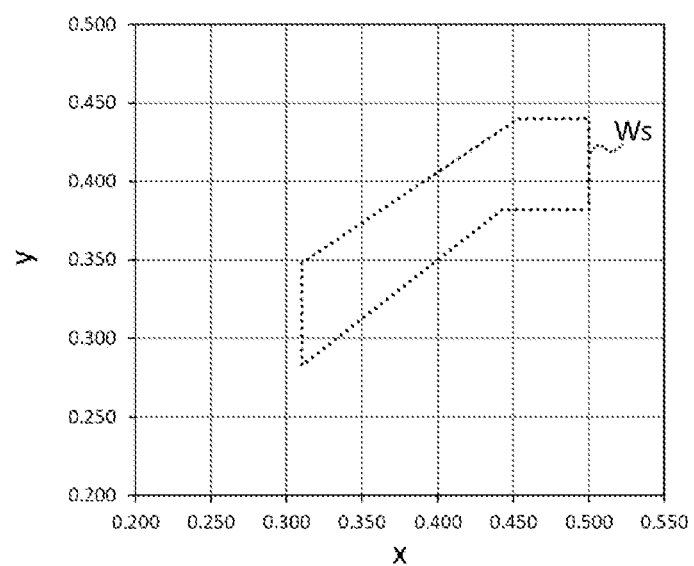
FIG. 2 shows a white region Ws defined by JIS D5500 or ECE in the CIE1931 chromaticity diagram.

The vehicle light-emitting device emits light in a white light range defined by JIS D5500 or a white color range defined by economic commission for Europe (ECE) through a color filter. A vehicle lighting device using the vehicle light-emitting device emits light, in which a decrease in luminous flux is suppressed even after the light passes through the color filter. A white region defined by JIS D5500 is a chromaticity range of $0.500 \geq x \geq 0.310$, $y \leq 0.150+0.640x$, $y \geq 0.050+0.750x$, and $0.440 \geq y \geq 0.382$ in chromaticity coordinates of JIS Z8701. FIG. 2 shows a white region Ws, defined by JIS D5500 or ECE, of the chromaticity coordinates in the chromaticity diagram. The chromaticity coordinates of JIS Z8701 are the same as the chromaticity coordinates of a color system recommended by CIE1931 (see JIS Z8701).

Figure 3:
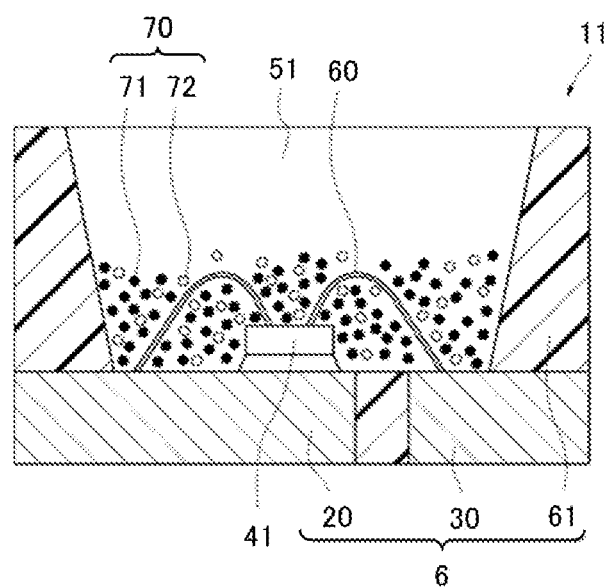
FIG. 3 is a schematic cross-sectional view illustrating a first example of a vehicle light-emitting device.

An example of the vehicle light-emitting device is described with reference to the drawings. FIG. 3 is a schematic cross-sectional view illustrating a first example of the vehicle light-emitting device.

As illustrated in FIG. 3, a vehicle light-emitting device 11 includes a light-emitting element 41 having a peak emission wavelength of 400 nm or greater and 510 nm or less, and a fluorescent member 51 including a first phosphor 71 that is excited by light emitted by the light-emitting element 41 and emits light having a peak emission wavelength of 480 nm or greater and 530 nm or less and a second phosphor 72 that is excited by the light emitted by the light-emitting element 41 and emits light having a peak emission wavelength of 540 nm or greater and 600 nm or less. A phosphor 70 includes the first phosphor 71 and the second phosphor 72.

The vehicle light-emitting device 11 includes a molded body 6, the light-emitting element 41, and the fluorescent member 51. The molded body 6 is formed by integrally molding a first lead 20, a second lead 30, and a resin portion 61 including a thermoplastic resin or a thermosetting resin. The molded body 6 may be referred to as a package 6. The molded body 6 has a recess defined by a surface forming the bottom of the recess and inner lateral surfaces, and the light-emitting element 41 is mounted on the surface forming the bottom of the recess. The light-emitting element 41 includes positive and negative electrodes, which are a pair, and the positive and negative electrodes are electrically connected to the first lead 20 and the second lead 30 via wires 60, respectively. The light-emitting element 41 is covered with the fluorescent member 51. The fluorescent member 51 includes the phosphor 70 including the first phosphor 71 and the second phosphor 72, and a light-transmissive material. The fluorescent member 51 also has a function of a sealing member that covers the light-emitting element 41 and the phosphor 70 in the recess of the molded body 6. Electric power can be supplied from the outside via the first lead 20 and the second lead 30 connected to the pair of positive and negative electrodes of the light-emitting element 41, thereby causing the vehicle light-emitting device 11 to emit light.

The light-emitting element has a peak emission wavelength of 400 nm or greater and 510 nm or less. The light-emitting element preferably has a peak emission wavelength of 410 nm or greater and 480 nm or less, or more preferably has a peak emission wavelength of 420 nm or greater and 460 nm or less. For example, a light-emitting diode (LED) or a laser diode (LD) can be used as the light-emitting element. For example, an LED chip can be used as the light-emitting element. A semiconductor light-emitting element using a nitride semiconductor represented by $In_XAl_YGa_{1-X-Y}N$ (0≤X, 0≤Y, X+Y≤1) can be used for the light-emitting element. Various emission wavelengths of the nitride semiconductor can be selected depending on a material for a semiconductor layer and the degree of mixed crystals of the semiconductor layer. The light-emitting element is not particularly limited in shape, size, mounting form (flip chip, wire bonding) on a molded body including a lead ("molded body" is also referred to as "package"), and the like as long as the light-emitting element emits light in an amount necessary for the vehicle light-emitting device.

The first phosphor preferably includes at least one phosphor selected from the group consisting of a silicate phosphor having a composition represented by Formula (1a) below, a first rare earth aluminate phosphor having a composition represented by Formula (1b) below, and a β-SiAlON phosphor having a composition represented by Formula (1c) below.

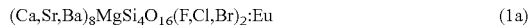

$$(Ca,Sr,Ba)_8MgSi_4O_{16}(F,Cl,Br)_2:Eu \qquad (1a)$$

$$(Lu,Y,Gd,Tb)_3(Al,Ga)_5O_{12}:Ce \qquad (1b)$$

$$Si_{6-z}Al_zO_zN_{8-z}:Eu(0<z\leq4.2) \qquad (1c)$$

In the present specification, in the compositional formulas representing the compositions of the phosphors, characters preceding the colon (:) represent elements constituting a host crystal and molar ratios thereof and characters following the colon (:) represent activating elements. In the present specification, a plurality of elements separated by commas (,) in the formula representing the composition of the phosphor mean that at least one of the plurality of elements is contained in the composition, and a combination of two or more of the plurality of elements may be contained in the composition.

The first rare earth aluminate phosphor having the composition represented by Formula (1b) above has a composition different from the composition of a second rare earth aluminate phosphor having a composition represented by Formula (2a) to be described below, and the first rare earth aluminate phosphor, which is the first phosphor, and the second rare earth aluminate phosphor, which is the second phosphor, contain different rare earth elements in respective compositions, or the first rare earth aluminate phosphor contains Ga in the composition when the first rare earth aluminate phosphor and the second rare earth aluminate phosphor contain the same rare earth elements in their compositions.

The second phosphor preferably includes the second rare earth aluminate phosphor having the composition represented by Formula (2a) below.

$$(Y,Gd,Tb)_3Al_5O_{12}:Ce \qquad (2a)$$

The fluorescent member of the vehicle light-emitting device may contain a third phosphor that is excited by the light emitted by the light-emitting element and emits light having a peak emission wavelength of 605 nm or greater and 670 nm or less.

The median particle size of the phosphor is preferably 3 μm or greater and 50 μm or less, may be 5 μm or greater and 40 μm or less, and may be 8 μm or greater and 35 μm or less. When the median particle size is 3 μm or greater and 50 μm or less, light having a target luminous flux is easily emitted. The median particle size of the phosphor is a volume-based median particle size, and refers to a particle size corresponding to 50% of a cumulative volume from a small diameter side in a volume-based particle size distribution. The particle size distribution of the phosphor is measured by a laser diffraction method using a laser diffraction particle size distribution measuring device. The phosphor includes the first phosphor and the second phosphor as described above, and may include the third phosphor to be described below.

Figure 4:
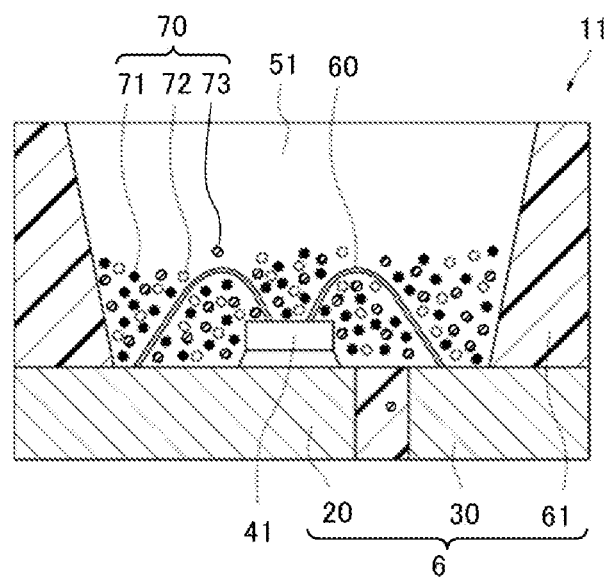
FIG. 4 is a schematic cross-sectional view illustrating a second example of a vehicle light-emitting device.

FIG. 4 is a schematic cross-sectional view illustrating a second example of the vehicle light-emitting device 11. As illustrated in FIG. 4, the vehicle light-emitting device 11 is the same as the vehicle light-emitting device 11 illustrated in FIG. 3 except that the fluorescent member 51 includes, in the phosphor 70, a third phosphor 73 that is excited by the light emitted by the light-emitting element 41 and emits light having a peak emission wavelength of 605 nm or greater and 670 nm or less. In FIG. 4, the same members as those in FIG. 3 are denoted by the same reference signs.

The third phosphor preferably includes at least one phosphor selected from the group consisting of a first nitride phosphor having a composition represented by Formula (3a) below and a second nitride phosphor having a composition represented by Formula (3b) below.

$$(Sr,Ca)AlSiN_3:Eu \qquad (3a)$$

$$(Ba,Sr)_2Si_5N_8:Eu \qquad (3b)$$

The fluorescent member may include a light-transmissive material and the phosphor that is excited by light emitted by the light-emitting element and emits an amount of light corresponding to that in the region AL in the chromaticity diagram, which is emitted by the vehicle light-emitting device. Specifically, the amount of the phosphor including the first phosphor and the second phosphor may be 10 parts by mass or greater and 250 parts by mass or less, 15 parts by mass or greater and 200 parts by mass or less, or 20 parts by mass or greater and 180 parts by mass or less with respect to 100 parts by mass of the light-transmissive material. The content of the first phosphor may be 5 mass % or greater and 99 mass % or less, 10 mass % or greater and 98 mass % or less, or 20 mass % or greater and 97 mass % or less with respect to the total amount 100 mass % of the phosphor. When the phosphor does not contain the third phosphor, the total amount of the phosphor may be the total amount of the first phosphor and the second phosphor. The phosphor need not include the third phosphor, and the content of the third phosphor may be 0 mass % or greater and 30 mass % or less, 3 mass % or greater and 20 mass % or less, or in the range of 5 mass % or greater and 10 mass % or less with respect to the total amount 100 mass % of the phosphor.

The light-transmissive material contained in the fluorescent member may be at least one selected from the group consisting of a resin, glass, and an inorganic substance, and is preferably a resin. The resin is preferably at least one selected from the group consisting of an epoxy resin, a silicone resin, a phenol resin, and a polyimide resin. The inorganic substance may be at least one selected from the group consisting of aluminum oxide and aluminum nitride. The fluorescent member may contain a filler, a coloring agent, and a light diffusing material as necessary, in addition to the phosphor and the light-transmissive material. Examples of the filler include silicon oxide, barium titanate, titanium oxide, and aluminum oxide. The content of the other components other than the phosphor and the light-transmissive material contained in the fluorescent member may be the total content of the other components, and may be 0.01 parts by mass or greater and 50 parts by mass or less, 0.1 parts by mass or greater and 45 parts by mass or less, or 0.5 parts by mass or greater and 40 parts by mass or less with respect to 100 parts by mass of the light-transmissive material.

An example of a method for manufacturing the vehicle light-emitting device is described. For details, reference can be made to the disclosure of JP 2010-062272 A, for example. The method for manufacturing the vehicle light-emitting device preferably includes a step of preparing a molded body, a step of disposing a light-emitting element, a step of disposing a composite for a fluorescent member, and a step of forming a resin package.

In the step of preparing the molded body, a plurality of leads are integrally molded with a thermosetting resin or a thermoplastic resin to prepare a molded body having a recess defined by inner lateral surfaces and a surface forming the bottom of the recess. In the step of disposing the light-emitting element, a light-emitting element is disposed on the surface forming the bottom of the recess of the molded body, and positive and negative electrodes of the light-emitting element are connected to a first lead and a second lead by wires. In the step of disposing the composite for the fluorescent member, the composite for the fluorescent member is disposed in the recess of the molded body. In the step of forming the resin package, the composite for the fluorescent member disposed in the recess of the molded body is cured to form the fluorescent member, so that the resin package is formed. Thus, the vehicle light-emitting device is manufactured. In this manner, the vehicle light-emitting device illustrated in FIG. 3 or 4 can be manufactured.

The vehicle light-emitting device is not limited to a package using a molded body having a recess defined by a surface forming the bottom of the recess and inner lateral surfaces, but may have a structure, for example, including a fluorescent member that covers a light-emitting element mounted on a package having a flat plate shape (wiring substrate). The vehicle light-emitting device may use, for example, a ceramic composite having a plate shape and obtained by sintering a phosphor and an inorganic material as a fluorescent member. For one example of a form of the vehicle light-emitting device, reference can be made to the disclosure of JP 2020-58695 A.

The vehicle lighting device includes the above-described vehicle light-emitting device and a color filter at a position on which light emitted by the vehicle light-emitting device is incident. A maximum transmittance of the color filter for light in the range of 410 nm to 480 nm is more than 50% and 90% or less. A minimum transmittance of the color filter for light in the range of 500 nm to 550 nm is more than 20% and 70% or less. A transmittance of the color filter for light in the range of 600 nm to 730 nm is 80% or more. Light emitted from the vehicle light-emitting device passes through the color filter, so that the vehicle lighting device emits white light. For the color filter, a filter having the above-described transmittances in respective wavelength ranges and being in a color of red or pink slightly lighter than red may be used. Light emitted by the vehicle light-emitting device that emits light in the region AL in the above-described chromaticity diagram passes through the color filter having specific transmittances in respective wavelength ranges, and thus white light is emitted. The white light emitted from the vehicle lighting device can be emitted as white light in the white region Ws defined by JIS D5500 or ECE in the chromaticity diagram.

Figure 5:
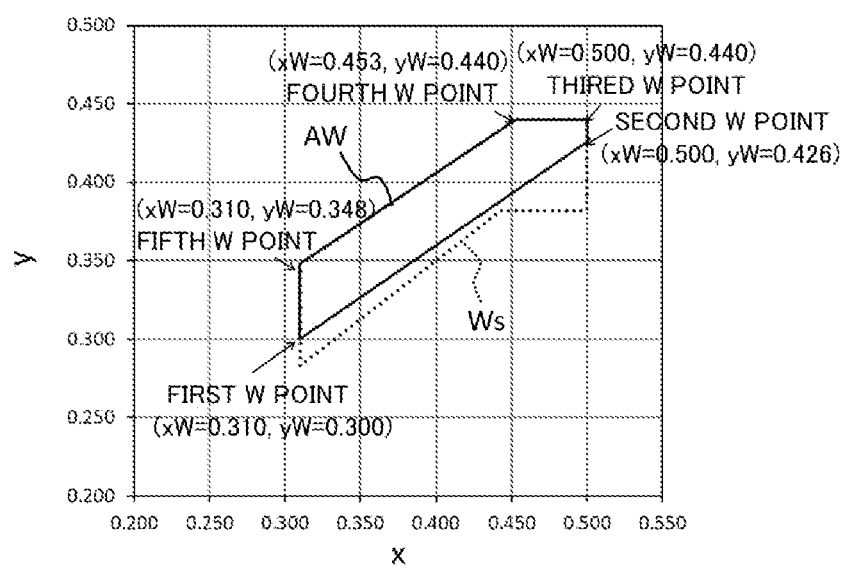
FIG. 5 shows a region AW of white light emitted by a vehicle lighting device and a white region Ws defined by JIS D5500 or ECE in the CIE1931 chromaticity diagram.

The vehicle light-emitting device is preferably configured to emit white light having chromaticity existing in a region AW in a CIE 1931 chromaticity diagram in which chromaticity is defined by x and y coordinates, the region AW defined by a first W straight line connecting a first W point at chromaticity coordinates (xW, yW) of (xW=0.310, yW=0.300) and a second W point at (xW=0.500, yW=0.426), a second W straight line connecting the second W point and a third W point at (xW=0.500, yW=0.440), a third W straight line connecting the third W point and a fourth W point at (xW=0.453, yW=0.440), and a fourth W straight line connecting the fourth W point and a fifth W point at (xW=0.310, yW=0.348), and a fifth W straight line connecting the fifth W point and the first W point. FIG. 5 shows the region AW of white light emitted by the vehicle lighting device and the white region Ws defined by JIS D5500 or ECE in the chromaticity diagram. The light emitted by the above-described vehicle light-emitting device passes through the above-described color filter, and then the vehicle lighting device including the vehicle light-emitting device and the color filter emits white light in the specific region AW within the white region Ws defined by JIS D5500 or ECE in the chromaticity diagram. In the vehicle lighting device, a plurality of vehicle light-emitting devices can be covered using a cover provided with one color filter or a cover formed of one color filter, and the vehicle lighting device can emit white light in the defined white region Ws through one color filter of the vehicle lighting device.

Thus, the degree of freedom in design of a vehicle can be increased.

In the vehicle lighting device, a lumen maintenance factor indicating a ratio obtained by dividing the luminous flux of white light after passage through the color filter by the luminous flux of light emitted by the vehicle light-emitting device before passage through the color filter is preferably 40% or greater and 75% or less. When the lumen maintenance factor of the vehicle lighting device is 40% or greater and 75% or less, a decrease in the luminous flux of light emitted by the vehicle light-emitting device included in the vehicle lighting device after passing through the color filter is suppressed, and white light maintaining the luminous flux even after passage through the color filter is emitted from the vehicle light-emitting device. The lumen maintenance factor of the vehicle lighting device is more preferably 45% or greater and 70% or less.

Figure 6:
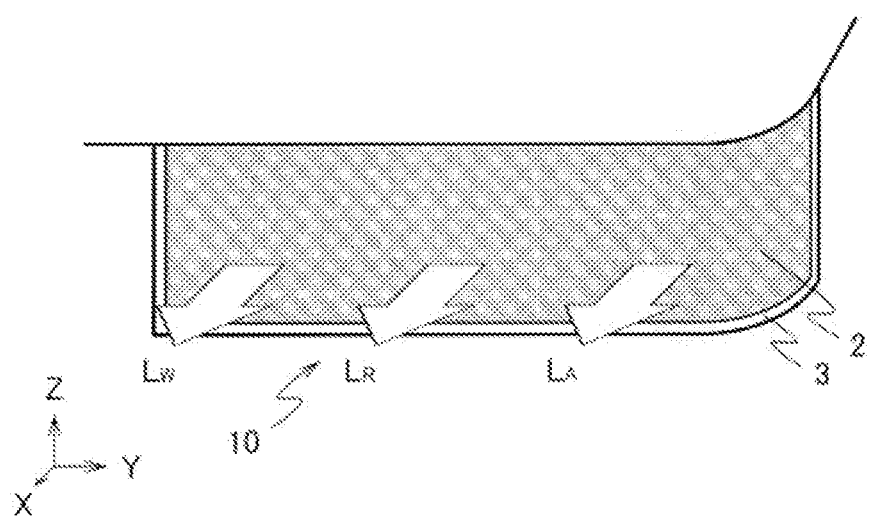
FIG. 6 is an external view schematically illustrating a state in which the vehicle lighting device is attached to a vehicle body.
Figure 7:
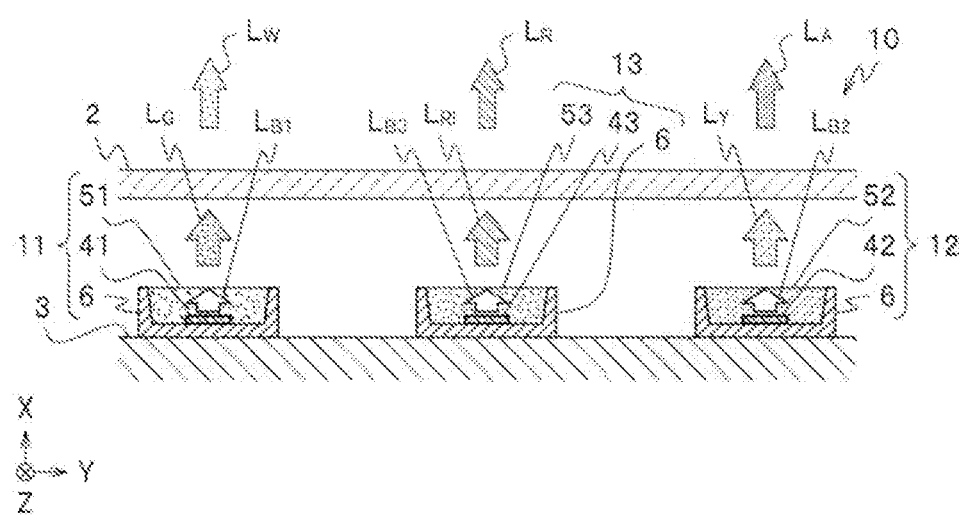
FIG. 7 is an enlarged cross-sectional view schematically illustrating a partial configuration of the vehicle lighting device.

An example of the vehicle lighting device is described with reference to the drawings. FIG. 6 is an external view schematically illustrating a state in which the vehicle lighting device is attached to a vehicle body. FIG. 7 is an enlarged cross-sectional view schematically illustrating a partial configuration of the vehicle lighting device. In the cross-sectional view of FIG. 7, unless otherwise specified, the vertical direction is the same as the vertical direction in the drawing showing the cross-section of FIG. 7.

A vehicle lighting device 10 includes a housing 3 and a color filter 2 covering an opening of the housing 3. In the housing 3, the above-described vehicle light-emitting device 11 that allows for emitting white light after passage through the color filter 2 is provided. The above-described vehicle light-emitting device 11 that emits white light is referred to as a first vehicle light-emitting device 11. As described above, the first vehicle light-emitting device 11 includes the light-emitting element 41, the package 6, and the fluorescent member 51 including the phosphor including the first phosphor and the second phosphor. The light-emitting element 41 is also referred to as a first light-emitting element 41. The fluorescent member 51 is also referred to as a first fluorescent member 51. In the first vehicle light-emitting device 11, the first fluorescent member 51 is provided at a position on which light $L_{B1}$ emitted by the first light-emitting element 41 is incident. The phosphor contained in the first fluorescent member 51 converts wavelength of the light $L_{B1}$ emitted by the light-emitting element 41, and thus the first vehicle light-emitting device 11 emits light $L_G$ that is light having a chromaticity at chromaticity coordinates in the region AL in the chromaticity diagram. The light $L_G$ having a chromaticity corresponding to chromaticity coordinates in the region AL of the chromaticity diagram, which is emitted by the first vehicle light-emitting device 11, passes through the color filter 2, and white light $L_W$ having a chromaticity at chromaticity coordinates in the region AW in the chromaticity diagram is emitted from the vehicle lighting device 10.

The vehicle lighting device preferably includes a second vehicle light-emitting device 12 and a third vehicle light-emitting device 13 as well as the first vehicle light-emitting device 11. The second vehicle light-emitting device 12 includes a second light-emitting element 42, the package 6, and a second fluorescent member 52 including a phosphor. The phosphor contained in the second fluorescent member 52 converts wavelength of light $L_{B2}$ emitted by the second light-emitting element 42, and the second vehicle light-emitting device 12 emits light $L_Y$. The light $L_Y$ emitted by the second vehicle light-emitting device 12 passes through the color filter 2, and orange light $L_A$ is emitted from the vehicle lighting device 10. The third vehicle light-emitting device 13 includes a third light-emitting element 43, the package 6, and a third fluorescent member 53 containing a phosphor. The phosphor contained in the third fluorescent member 53 converts wavelength of light $L_{B3}$ emitted by the third light-emitting element 43, and the third vehicle light-emitting device 13 emits light $L_{Ri}$. The light $L_{Ri}$ emitted by the third vehicle light-emitting device 13 passes through the color filter 2, and red light $L_R$ is emitted from the vehicle lighting device 10. The vehicle lighting device 10 may include at least the first vehicle light-emitting device 11, and may include one or both of the second vehicle light-emitting device 12 and the third vehicle light-emitting device 13. The vehicle lighting device 10 may include two or more first vehicle light-emitting devices 11 and no second vehicle light-emitting device and/or no third vehicle light-emitting device.

For the vehicle lighting device, a set of two bilaterally symmetrical lighting devices is used at the rear of the vehicle body. The vehicle lighting device has an approximate shape of a rectangular parallelepiped that is long in a vehicle width direction (Y direction in FIG. 6 or 7) of a vehicle to which the vehicle lighting device is attached, and is embedded in and attached to the vehicle body such that an irradiation surface is exposed to a rear surface of the vehicle body. In the vehicle lighting device, the irradiation surface is divided into three regions in the Y direction, and each of these regions emits a respective one of the white light $L_W$, the red light $L_R$, and the orange light $L_A$ in order from the center in the vehicle width direction toward the side surface of the vehicle body. The vehicle lighting device 10 reflects red light from the color filter 2 that covers the entire irradiation surface by light from the outside. In the present specification, the term "orange" includes amber.

The white light $L_W$ is lamplight of a backing light of a vehicle, the orange light $L_A$ is lamplight of a direction indicator, the red light $L_R$ is lamplight of a brake light and a taillight, and their light colors are defined by JIS D5500. As described above, the white light $L_W$ has chromaticity coordinates in the region AW within the region Ws defined by JIS D5500 in the chromaticity diagram. The orange light $L_A$ is defined in a chromaticity range of 0.429≥y≥0.398 and z≤0.007 in the chromaticity coordinates of JIS Z8701. The red light $L_R$ is defined in a chromaticity range of y≤0.335 and z≤0.008 in the chromaticity coordinates of JIS Z8701. The light color of light reflected by the irradiation surface of the vehicle lighting device is preferably defined in the same chromaticity range as the chromaticity range of the red light $L_R$.

As the second light-emitting element and the third light-emitting element, light-emitting elements similar to the first light-emitting element can be used.

The phosphor contained in the second fluorescent member preferably has a peak emission wavelength of 550 nm or greater and 630 nm or less. The phosphor contained in the second fluorescent member more preferably has a peak emission wavelength of 560 nm or longer, still more preferably has a peak emission wavelength of 570 nm or longer, and yet still more preferably has a peak emission wavelength of 600 nm or shorter. Examples of such a phosphor include oxide phosphors such as an yttrium aluminum garnet phosphor (YAG phosphor), a lutetium aluminum garnet phosphor, a terbium aluminum garnet phosphor, and a garnet phosphor obtained by substituting a part of the composition of any of these phosphors, and nitride phosphors such as $(Ba,Sr)_2Si_5N_8$:Eu. The phosphor contained in the second fluorescent member may include a phosphor having the same composition as the phosphor contained in the first fluorescent member as long as the phosphor has a peak emission wavelength of 550 nm or greater and 630 nm or less. For the second vehicle light-emitting device, reference can be made to the disclosure of JP 2019-133794 A, for example.

The phosphor contained in the third fluorescent member preferably has a peak emission wavelength of 600 nm or greater and 700 nm or less. The phosphor contained in the third fluorescent member more preferably has a peak emission wavelength of 610 nm or longer, and still more preferably has a peak emission wavelength of 630 nm or longer. Examples of such a phosphor include nitride phosphors such as $CaAlSiN_3$:Eu (CASN phosphor), $(Ca,Sr) AlSiN_3$:Eu, $(Ca,Sr)_3Si_5N_8$:Eu, $SrLiAl_3N_4$:Eu, and $(Ba,Sr)_2Si_5N_8$:Eu, and oxynitride phosphors such as $Ca_u(S^1,Al)_{12}(O,N)_{16}$:Eu (u satisfies 0<u≤2.0). For the third vehicle light-emitting device, reference can be made to the disclosure of JP 2019-133794 A, for example.

The color filter is provided at a position on which light emitted by the first vehicle light-emitting device 11, the second vehicle light-emitting device 12, and the third vehicle light-emitting device 13 is incident. The color filter serves as a cover of the vehicle lighting device, that is, a so-called outer lens of a vehicle lamp, and is provided to impart a function of a reflector to at least a part of the irradiation surface of the vehicle lighting device. When light is incident on the color filter from the outside, the color filter reflects red light; thus, the color filter has a function of a reflector.

A maximum transmittance of the color filter for light in the range of 410 nm to 480 nm is more than 50% and 90% or less, a minimum transmittance of the color filter in the range of 500 nm to 550 nm is more than 20% and 70% or less, and a transmittance of the color filter for light in the range of 600 nm to 730 nm is 80% or more. With the color filter having the maximum transmittance in the range of 410 nm to 480 nm of more than 50% and 90% or less and the minimum transmittance in the range of 500 nm to 550 nm of more than 20% and 70% or less, first light $L_G$ emitted by the first vehicle light-emitting device 11 passes through the color filter while reducing a decrease in the luminous flux of the first light $L_G$, and white light in the region AW included in the white region Ws defined in the chromaticity diagram is emitted.

The minimum transmittance T of the color filter for light in the range of 500 nm to 550 nm is more than 20% and 70% or less ($20<T\leq70$). The minimum transmittance T for light in the range of 500 nm to 550 nm may be in the range of 25% to 65% ($25\leq T\leq65$), in the range of 28% to 60%, in the range of 30% to 60% ($30\leq T\leq60$), or in the range of 30% to 55% ($30\leq T\leq55$).

The color filter can transmit the orange light $L_A$ emitted by the second vehicle light-emitting device and the red light $L_R$ emitted by the third vehicle light-emitting device while having a transmittance of 80% or more for light in the range of 600 nm to 730 nm and thus having a function of a reflector that reflects red light. The vehicle lighting device can emit the white light $L_W$, which is lamplight for a backing light maintaining a high luminous flux, the orange light $L_A$, which is lamplight for a direction indicator, and the red light $L_R$, which is lamplight for a brake light and/or a taillight, through one color filter having a function of a reflector. Thus, the degree of freedom in design can be increased. The color filter may have a transmittance of 85% or more and 100% or less for light at a wavelength of 600 nm or greater and 730 nm or less.

As the color filter, a filter colored with a red pigment such as an azo compound, a cyanine compound, a perylene compound, or a dioxazine compound and made of a transparent resin having a necessary strength such as an acrylic resin or a polycarbonate resin can be used. The color filter also has a function of an outer lens and is also referred to as an outer lens, but may have a lens function or may have no lens function and allow light to pass therethrough. The color filter may be provided, on the back surface (inner surface) or the surface thereof, with irregularities (lens cuts, microprisms) so that at least a partial region serves as a retroreflector.

The housing includes an irradiation surface that is open, and constitutes an exterior of the vehicle lighting device. The housing accommodates the first vehicle light-emitting device, the second vehicle light-emitting device, and the third vehicle light-emitting device, the color filter is disposed covering the opening, and the housing supports the color filter. The housing is preferably a light reflector having an inner surface serving as a reflective surface. With such a housing, the lights $L_G$, $L_y$, and $L_{Ri}$ are emitted by the first vehicle light-emitting device, the second vehicle light-emitting device, and the third vehicle light-emitting device toward the color filter, and the white light $L_W$, the orange light $L_A$, and the red light $L_R$ are emitted from the vehicle lighting device so as to spread at a predetermined angle from the rear of a vehicle. The housing preferably has a structure in which the first vehicle light-emitting device, the second vehicle light-emitting device, and the third vehicle light-emitting device are detachable and each of the vehicle light-emitting devices is individually replaceable. The intervals (pitches) at which the first vehicle light-emitting device, the second vehicle light-emitting device, and the third vehicle light-emitting device are arranged in the housing need not be the same. Partitions may be provided between the vehicle light-emitting devices. The vehicle lighting device does not necessarily use a vehicle light-emitting device using a molded body having a recess, but for example, may use a vehicle light-emitting device including a fluorescent member formed in a dome shape, or a vehicle light-emitting device using, for example, a ceramic composite having a plate shape and obtained by sintering a phosphor and an inorganic material, as a fluorescent member.

Figure 8:
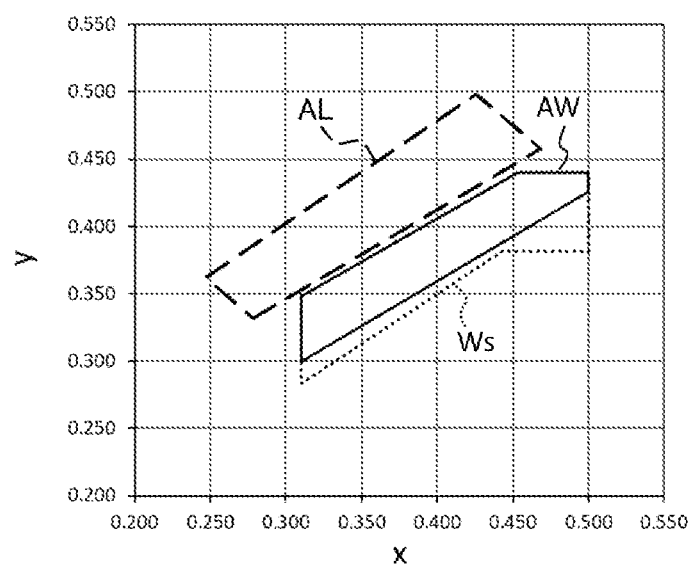
FIG. 8 shows a region AL of light emitted by the vehicle light-emitting device, a region AW of white light emitted from the vehicle lighting device, and a white region Ws defined by JIS D5500 or ECE in the CIE1931 chromaticity diagram.

FIG. 8 shows the region AL of light emitted by the first vehicle light-emitting device, which is a vehicle light-emitting device that allows for emitting white light through a color filter, the region AW of white light emitted from a vehicle lighting device after the light emitted by the first vehicle light-emitting device passes through the color filter, and the white region Ws defined by JIS D5500 or ECE in the chromaticity diagram. When the first vehicle light-emitting device emits light in the region AL, the light emitted by the first vehicle light-emitting device passes through the color filter, and white light in the region AW is emitted from the vehicle lighting device, even after the light emitted by the first vehicle light-emitting device passes through the color filter having a function of a reflector, a decrease in the luminous flux of the light is suppressed, and white light maintaining the luminous flux is emitted from the vehicle lighting device. Thus, the degree of freedom in design of the vehicle lighting device can be improved.

The vehicle lighting device is preferably configured such that, in a graph Gx in which a horizontal axis represents the minimum transmittance T (%) for light in the range of 500 nm to 550 nm of the color filter, an x-coordinate of the chromaticity coordinates of light emitted by the vehicle light-emitting device before passing through the color filter is an xL value and an x-coordinate of the chromaticity coordinates of white light after passage through the color filter is an xW value in the chromaticity diagram, a difference obtained by subtracting the xL value from the xW value is Δx, and a vertical axis represents Δx, Δx preferably satisfies Formula (Ix) below, and in a graph Gy in which a horizontal axis represents the minimum transmittance T (%) for light in the range of 500 nm to 550 nm of the color filter, a y-coordinate of the chromaticity coordinates of the light emitted by the vehicle light-emitting device before passing through the color filter is a yL value and a y-coordinate of the chromaticity coordinates of the white light after passage through the color filter is a yW value in the chromaticity diagram, a difference obtained by subtracting the yL value from the yW value is Δy, and a vertical axis represents Δy, Δy preferably satisfies Formula (Iy) below. It is preferable that a maximum transmittance of the color filter for light in the range of 410 nm to 480 nm is more than 50% or more and 90% or less, a minimum transmittance of the color filter for light in the range of 500 nm to 550 nm is more than 20% and 70% or less, and a transmittance of the color filter in the range of 600 nm to 730 nm is 80% or more.

$$\Delta x = S^1 \times T + I^1 \quad\quad\quad\quad (Ix)$$

(in the graph Gx above, in Formula (Ix), $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively)

$$\Delta y = S^2 x\ T + I^2 \qquad (Iy)$$

(in the graph Gy above, in Formula (Iy), $S^2$ represents a slope, $I^2$ represents an intercept, and $S^2$, $I^2$, and T satisfy $0 \leq S^2 \leq 0.002$, $-0.114 \leq I^2 \leq -0.030$, and $20 < T \leq 70$, respectively)

When the difference Δx between the xW value of the white light after passage through the color filter and the xL value of the light emitted by the first vehicle light-emitting device before passage through the color filter satisfies Formula (Ix) and the difference Δy between the yW value of the white light after passage through the color filter and the yL value of the light emitted by the first vehicle light-emitting device before passage through the color filter satisfies Formula (Iy) in consideration of the minimum transmittance T for light in the range of 500 nm to 550 nm of the color filter, the white light with less decrease in the luminous flux in the specific region AW within the white region Ws defined by JIS D5500 or ECE is emitted from the vehicle lighting device after passage through the color filter, and thus prescribed white light can be emitted using a single color filter.

Thus, it is possible to improve the degree of freedom in design of a vehicle lighting device that can be used as a rear combination lamp for a vehicle body.

The vehicle lighting device preferably emits white light in which Δx is 0.025 or greater and 0.085 or less in Formula (Ix) above and Δy is −0.055 or greater and −0.005 or less in Formula (Iy) above. When Δx is 0.025 or greater and 0.085 or less in Formula (Ix) above and Δy is −0.055 or greater and −0.005 or less in Formula (Iy) above, a decrease in the luminous flux of light emitted by the vehicle light-emitting device is suppressed using a color filter having a minimum transmittance of more than 20% and 70% or less for light in the range of 500 nm to 550 nm, so that white light in the white region Ws defined by JIS D5500 or ECE can be emitted from the vehicle lighting device.

The respective numerical ranges of $S^1$, $I^1$ and Δx in Formula (Ix) and the respective numerical ranges of $S^2$, $I^2$ and Δy in Formula (Iy) can be measured using a vehicle lighting device using at least two color filters having different minimum transmittances T for light in the range of 500 nm to 550 nm. The vehicle lighting device can emit white light satisfying Formula (Ix) and Formula (Iy), and emit white light in the white region Ws defined by JIS D5500 or ECE while maintaining the luminous flux of the light emitted by the first vehicle light-emitting device.

Certain embodiments of the present disclosure include vehicle light-emitting devices and vehicle lighting devices of Aspects 1 to 12 described below.

Aspect 1

A vehicle light-emitting device including:
a light-emitting element having a peak emission wavelength of 400 nm or greater and 510 nm or less; and
a fluorescent member containing a first phosphor that is excited by light emitted by the light-emitting element and emits light having a peak emission wavelength of 480 nm or greater and 530 nm or less and a second phosphor that is excited by the light emitted by the light-emitting element and emits light having a peak emission wavelength of 540 nm or greater and 600 nm or less, wherein
the vehicle light-emitting device is configured to emit light having chromaticity existing in a region AL in a CIE 1931 chromaticity diagram in which chromaticity is defined by x and y coordinates, the region AL defined by a first L straight line connecting a first L point at chromaticity coordinates (xL, yL) of (xL=0.278, yL=0.332) and a second L point at (xL=0.468, yL=0.458), a second L straight line connecting the second L point and a third L point at (xL=0.426, yL=0.498), a third L straight line connecting the third L point and a fourth L point at (xL=0.247, yL=0.362), and a fourth L straight line connecting the fourth L point and the first L point.

Aspect 2

The vehicle light-emitting device according to aspect 1, wherein the first phosphor contains at least one phosphor selected from the group consisting of a silicate phosphor having a composition represented by Formula (1a) below, a first rare earth aluminate phosphor having a composition represented by Formula (1b) below, and a β-SiAlON phosphor having a composition represented by Formula (1c) below.

$$(Ca,Sr,Ba)_8MgSi_4O_{16}(F,Cl,Br)_2{:}Eu \qquad (1a)$$

$$(Lu,Y,Gd,Tb)_3(Al,Ga)_5O_{12}{:}Ce \qquad (1b)$$

$$Si_{6-z}Al_zO_zN_{8-z}{:}Eu(0 \leq z \leq 4.2) \qquad (1c)$$

Aspect 3

The vehicle light-emitting device according to aspect 1 or 2, wherein the second phosphor contains a second rare earth aluminate phosphor having a composition represented by Formula (2a) below.

$$(Y,Gd,Tb)_3Al_5O_{12}{:}Ce \qquad (2a)$$

Aspect 4

The vehicle light-emitting device according to any one of aspects 1 to 3, wherein the fluorescent member contains a third phosphor that is excited by the light emitted by the light-emitting element and emits light having a peak emission wavelength of 605 nm or greater and 670 nm or less.

Aspect 5

The vehicle light-emitting device according to aspect 4, wherein the third phosphor contains at least one phosphor selected from the group consisting of a first nitride phosphor having a composition represented by Formula (3a) below and a second nitride phosphor having a composition represented by Formula (3b) below.

$$(Sr,Ca)AlSiN_3{:}Eu \qquad (3a)$$

$$(Ba,Sr)_2Si_5N_8{:}Eu \qquad (3b)$$

Aspect 6

A vehicle lighting device including:
the vehicle light-emitting device according to any one of aspects 1 to 5; and
a color filter at a position on which light emitted by the vehicle light-emitting device is incident, wherein
a maximum transmittance of the color filter for light in a range of 410 nm to 480 nm is more than 50% and 90% or less,
a minimum transmittance of the color filter for light in a range of 500 nm to 550 nm is more than 20% and 70% or less, and a transmittance of the color filter for light in a range from 600 nm to 730 nm is 80% or more, and
the vehicle lighting device is configured such that light emitted from the vehicle light-emitting device is transmitted through the color filter to emit white light.

Aspect 7

The vehicle lighting device according to aspect 6, wherein the vehicle light-emitting device is configured to emit white light having chromaticity existing in a region AW in a CIE 1931 chromaticity diagram in which chromaticity is defined by x and y coordinates, the region AW defined by a first W straight line connecting a first W point at chromaticity coordinates (xW, yW) of (xW=0.310, yW=0.300) and a second W point at (xW=0.500, yW=0.426), a second W straight line connecting the second W point and a third W point at (xW=0.500, yW=0.440), a third W straight line connecting the third W point and a fourth W point at (xW=0.453, yW=0.440), and a fourth W straight line connecting the fourth W point and a fifth W point at (xW=0.310, yW=0.348), and a fifth W straight line connecting the fifth W point and the first W point.

Aspect 8

The vehicle lighting device according to aspect 6 or 7, wherein a lumen maintenance factor indicating a ratio obtained by dividing a luminous flux of the white light after passage through the color filter by a luminous flux of the light emitted by the vehicle light-emitting device before passage through the color filter is in a range of 40% to 75%.

Aspect 9

The vehicle lighting device according to any one of aspects 6 to 8, wherein in a graph Gx in which a horizontal axis represents the minimum transmittance T for light in the range of 500 nm to 550 nm of the color filter, an x-coordinate of the light emitted by the vehicle light-emitting device before passage through the color filter is an xL value and an x-coordinate of the white light after passage through the color filter is an xW value in the chromaticity coordinates of the CIE1931 chromaticity diagram, a difference obtained by subtracting the xL value from the xW value is Δx, and a vertical axis represents Δx, Δx satisfies Formula (Ix) below, and in a graph Gy in which a horizontal axis represents the minimum transmittance T for the light in the range of 500 nm to 550 nm of the color filter, a y-coordinate of the light emitted by the vehicle light-emitting device before passage through the color filter is a yL value and a y-coordinate of the white light after passage through the color filter is a yW value in the chromaticity coordinates of the CIE1931 chromaticity diagram, a difference obtained by subtracting the yL value from the yW value is Δy, and a vertical axis represents Δy, Δy satisfies Formula (Iy) below.

$$\Delta x = S^1 \times T + I^1 \tag{Ix}$$

(in the graph Gx, in Formula (Ix), $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively)

$$\Delta y = S^2 \times T + I^2 \tag{Iy}$$

(in the graph Gy, in Formula (Iy), $S^2$ represents a slope, $I^2$ represents an intercept, and $S^2$, $I^2$, and T satisfy $0 \leq S^2 \leq 0.002$, $-0.114 \leq I^2 \leq -0.030$, and $20 < T \leq 70$, respectively)

Aspect 10

The vehicle lighting device according to aspect 9, wherein in Formula (Ix), Δx is in a range of 0.025 to 0.085 and in Formula (Iy), Δy is in a range of −0.055 to −0.005.

Aspect 11

A vehicle lighting device including:
the vehicle light-emitting device according to any one of aspects 1 to 5; and
a color filter configured to transmit light emitted by the vehicle light-emitting device to emit white light, wherein
in a graph Gx in which a horizontal axis represents a minimum transmittance T of the color filter for light in the range of 500 nm to 550 nm, an x-coordinate of the chromaticity coordinates of the light emitted by the vehicle light-emitting device before passage through the color filter is an xL value and an x-coordinate of the chromaticity coordinates of the white light after passage through the color filter is an xW value in the CIE1931 chromaticity diagram, a difference obtained by subtracting the xL value from the xW value is Δx, and a vertical axis represents Δx, Δx satisfies Formula (Ix) below, and in a graph Gy in which a horizontal axis represents the minimum transmittance T of the color filter for the light in the range of 500 nm to 550 nm, a y-coordinate of the chromaticity coordinates of the light emitted by the vehicle light-emitting device before passage through the color filter is a yL value and a y-coordinate of the chromaticity coordinates of the white light after passage through the color filter is a yW value in the CIE1931 chromaticity diagram, a difference obtained by subtracting the yL value from the yW value is Δy, and a vertical axis represents Δy, Δy satisfies Formula (Iy) below.

$$\Delta x = S^1 \times T + I^1 \tag{Ix}$$

(in the graph Gx, in Formula (Ix), $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively)

$$\Delta y = S^2 \times T + I^2 \tag{Iy}$$

(in the graph Gy, in Formula (Iy), $S^2$ represents a slope, $I^2$ represents an intercept, and $S^2$, $I^2$, and T satisfy $0 \leq S^2 \leq 0.002$, $-0.114 \leq I^2 \leq -0.030$, and $20 < T \leq 70$, respectively)

Aspect 12

The vehicle lighting device according to aspect 11, wherein in Formula (Ix), Δx is in a range of 0.025 to 0.085 and in Formula (Iy), Δy is in a range of −0.055 to −0.005.

EXAMPLES

The present disclosure is described in detail below by using examples. The present disclosure is not limited to these examples.

The following first phosphor and second phosphor were used in vehicle light-emitting devices of the examples and comparative examples.

First Phosphor

As the first phosphor, a silicate phosphor (chlorosilicate) having a composition included in the compositional formula represented by Formula (1a) above, a first rare earth aluminate phosphor (G-LAG) having a composition included in the compositional formula represented by Formula (1b) above, containing Lu as a rare earth element, and containing Ga in the composition, and a β-SiAlON phosphor (β-SiAlON) having a composition included in the compositional formula represented by Formula (1c) above were prepared.

Second Phosphor

As the second phosphor, a second rare earth aluminate phosphor (YAG) having a composition included in the compositional formula represented by Formula (2a) above and containing Y as a rare earth element was prepared.

Third Phosphor

As the third phosphor, a nitride phosphor (SCASN) having a composition included in the compositional formula represented by Formula (3a) above was prepared.

Chromaticity Coordinates, Peak Emission Wavelengths, Full Widths at Half Maximum of Phosphors The phosphors were irradiated with light having an excitation wavelength of 450 nm by using a quantum efficiency measuring device QE-2000 (manufactured by Otsuka Electronics Co., Ltd.) to measure emission spectra at room temperature (about 25° C.), and from the emission spectra, xp values and yp values in the xy chromaticity coordinates of CIE1931, peak emission wavelengths, and full widths at half maximum were measured. The results are shown in Table 1 below.

Median Particle Sizes of Phosphors

For each phosphor, the volume-based particle size distribution of the phosphor was measured by a laser diffraction method using a laser diffraction particle size distribution measuring device MASTERSIZER 2000 (manufactured by Malvern Panalytical Ltd.), and a particle size corresponding to 50% of a cumulative volume from a small diameter side in the volume-based particle size distribution was taken as a media particle size. The results are shown in Table 1 below.

The composite for a wavelength conversion member filling the recess of the molded body 6 was heated and cured at 150° C. for three hours to form the package 6 including the fluorescent member 51 containing the first phosphor 71 and the second phosphor 72, so that a vehicle light-emitting device 100 was manufactured.

Color Filter

Figure 9:
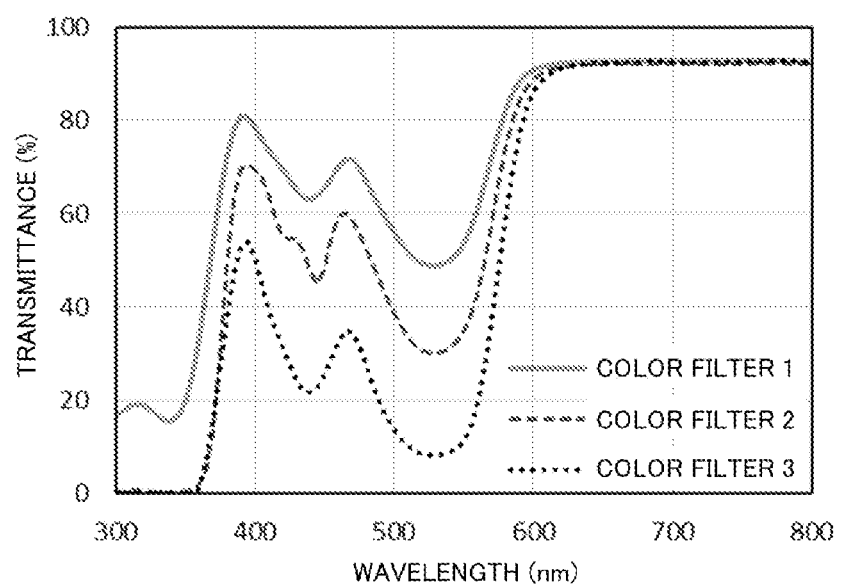
FIG. 9 is a diagram showing transmission spectra of color filters 1 to 3.

A color filter 1, a color filter 2, and a color filter 3 having different transmittances at respective wavelengths were prepared. The color filters 1 to 3 were irradiated with light in the normal direction of the color filter (incident angle of 0°), and transmission spectra in the range of wavelengths of 300 nm to 800 nm were measured at room temperature (25° C.±5° C.) using a spectrophotometer U-3900 (manufactured by Hitachi High-Tech Science Corporation). FIG. 9 shows the transmission spectra of the color filters 1 to 3. Table 2 below

TABLE 1

| Phosphor | | | Chromaticity Coordinates | | Peak Emission Wavelength (nm) | Full Width at Half Maximum (nm) | Median Particle Size (μm) |
|---|---|---|---|---|---|---|---|
| | | | xp | yp | | | |
| First Phosphor | Formula (1a) | Chlorosilicate | 0.256 | 0.650 | 521 | 63 | 29 |
| | Formula (1b) | G-LAG | 0.211 | 0.461 | 490 | 90 | 20 |
| | Formula (1c) | β-SiAlON | 0.283 | 0.675 | 528 | 47 | 9 |
| Second Phosphor | Formula (2a) | YAG | 0.450 | 0.534 | 561 | 115 | 17 |
| Third Phosphor | Formula (3a) | SCASN | 0.608 | 0.391 | 609 | 74 | 23 |

First to Fifth Examples and First Comparative Example

A light-emitting device having the configuration illustrated in FIG. 3 was manufactured.

As the light-emitting element 41, the light-emitting element 41 in which nitride semiconductor layers each having a peak emission wavelength of 450 nm are stacked was used. The light-emitting element 41 has a substantially rectangular planar shape with a length of about 2 mm and a width of about 3 mm, and has a thickness of about 0.7 mm. The first lead 20 and the second lead 30 were integrally molded with an epoxy resin to prepare the molded body (package) 6 including the resin portion 61 and having a recess defined by inner lateral surfaces and a surface forming the bottom of the recess.

The light-emitting element 41 was disposed on the surface forming the bottom of the recess of the molded body 6, and the positive and negative electrodes of the light-emitting element 41 were connected to the first lead 20 and the second lead 30 with the wires 60 made of gold (Au).

A silicone resin was used as a light-transmissive material contained in the fluorescent member 51. A composite for a fluorescent member was prepared such that the total amount of the first phosphor and the second phosphor with respect to 100 parts by mass of the light-transmissive material and the mixing ratio (mass %) of the first phosphor and the second phosphor with respect to 100 mass % of the total amount of the first phosphor and the second phosphor were as shown in Table 3 below. Subsequently, the prepared composite for the fluorescent member was filled into the recess of the molded body 6. In Table 3 below, the symbol "-" indicates that there is no corresponding item or numerical value.

shows the maximum transmittance (%) for light in the range of 410 nm to 480 nm, the minimum transmittance (%) for light in the range of 500 nm to 550 nm, and the transmittance for light in the range of 600 nm to 730 nm for the color filters 1 to 3. When the transmittance for light in the range of 600 nm to 730 nm is 80% or more, it is indicated as "80 or more".

TABLE 2

| | Maximum Transmittance in a range of 410 nm to 480 nm (%) | Minimum Transmittance in a range of 500 nm to 550 nm (%) | Transmittance in a range of 600 nm to 730 nm (%) |
|---|---|---|---|
| Color Filter 1 | 74 | 50 | 80 or more |
| Color Filter 2 | 64 | 30 | 80 or more |
| Color Filter 3 | 39 | 8 | 80 or more |

Sixth Example

The intensity at each wavelength of an emission spectrum having a color of (x=0.434, y=0.399) in the chromaticity coordinates of the chromaticity diagram and exhibited by the second phosphor and the third phosphor excited by light emitted by the light-emitting element used in the vehicle light-emitting device according to the first example and shown in Table 1 above was divided by the transmittance at each wavelength of the color filter 1 to calculate the emission spectrum having a color of (x=0.434, y=0.399) after passage through the color filter 1. When the color of the obtained spectrum was estimated by spectrum simulation software (manufactured by Nichia Corporation), it was (x=0.394, y=0.419). From the chromaticity of the light-emitting element used in the vehicle light-emitting device according to the first example and the chromaticities of the first phosphor and the second phosphor, it was estimated that the color of (x=0.394, y=0.419) could not be obtained only with the first phosphor and the second phosphor, and the third phosphor was considered to be necessary. Moreover, it was confirmed by the above-mentioned spectrum simulation software that the color of (x=0.434, y=0.399) after passage through the color filter 1 is actually obtained from the emission spectrum having a color of (x=0.434, y=0.399) after passage through the color filter 1 and exhibited from the first phosphor, the second phosphor, and the third phosphor and the transmittance of the color filter 1, and a lumen maintenance factor to be described below was calculated from the luminous fluxes before and after passage through the color filter.

Seventh Example and Second Comparative Example

The intensities at respective wavelengths in the emission spectrum corresponding to a color of (x=0.434, y=0.399) of light emitted from the second phosphor and the third phosphor, shown in Table 1, due to excitation by light emitted by the light-emitting element used in the vehicle light-emitting device according to the first example was divided by the transmittance at each wavelength of the color filter 2 or 3 to calculate the emission spectrum having a color of (x=0.434, y=0.399) after passage through the color filter 2 or 3. When the color of the obtained spectrum was estimated by using the above-mentioned spectrum simulation software, it was (x=0.365, y=0.440) in the seventh example and (x=0.292, y=0.501) in the second comparative example. From the chromaticity of the light-emitting element used in the vehicle light-emitting device according to the first example and the chromaticities of the first phosphor and the second phosphor, it was estimated that when the first phosphor and the second phosphor are used, the color of (x=0.434, y=0.399) can be obtained without using the third phosphor. Moreover, it was confirmed by the above-mentioned spectrum simulation software that the color of (x=0.434, y=0.399) after passage through the color filter 2 or 3 is actually obtained from the emission spectrum having a color of (x=0.434, y=0.399) after passage through the color filter 2 or 3 and exhibited by the first phosphor and the second phosphor and the transmittance of the color filter 2 or 3, and a lumen maintenance factor to be described below was calculated from the luminous fluxes before and after passage through the color filter.

Emission Spectra, Chromaticity Coordinates (xL, yL) (xW, yW), Δx, and Δy The emission spectra of light emitted by the vehicle light-emitting devices according to the first to fifth examples and the first comparative example were measured at room temperature (25° C.±5° C.) by using an optical measurement system combining a spectrophotometer PMA-11 (manufactured by Hamamatsu Photonics K.K.) and an integrating sphere. The chromaticity coordinates (xL, yL) of the chromaticity diagram were obtained from the emission spectra of the vehicle light-emitting devices. The chromaticity coordinates (xL, yL) of the light emission of the vehicle light-emitting devices according to the sixth and seventh examples and the second comparative example were derived by the spectrum simulation software as described above. For each of the vehicle light-emitting devices according to the first to seventh examples and the first and second comparative examples, the emission spectrum after passage through the color filter was derived from the emission spectrum of the corresponding vehicle light-emitting device and the transmittance at the wavelength of the corresponding color filter by using the spectrum simulation software, and was used as the emission spectrum of the corresponding vehicle lighting device of the first to seventh examples and the first and second comparative examples. The chromaticity coordinates (xW, yW) of white light of the corresponding vehicle lighting device after passage through the corresponding color filter were derived from the obtained emission spectrum of the vehicle lighting device after passage through the color filter. Table 3 below shows the chromaticity coordinates (xL, yL) of each of the vehicle light-emitting devices before passage through the color filter, the chromaticity coordinates (xW, yW) of each of the vehicle lighting devices after passage through the color filter, the difference Δx obtained by subtracting the xL value from the xW value, and the difference Δy obtained by subtracting the yL value from the yW value.

Lumen Maintenance Factor

For the vehicle light-emitting devices of the first to fifth examples and the first comparative example, the luminous flux of light emitted by the corresponding vehicle light-emitting device before passage through the corresponding color filter was measured using a total luminous flux measuring device using an integrating sphere. Using the spectrum simulation software, the luminous fluxes of light emitted by the corresponding vehicle light-emitting devices of the sixth and seventh examples and the second comparative example before passage through the corresponding color filters were obtained from the emission spectra of the vehicle light-emitting devices. Moreover, the luminous fluxes of the corresponding vehicle lighting devices of the first to seventh examples and the first and second comparative examples after passage through the corresponding color filters were derived from the emission spectra of the vehicle light-emitting devices and the transmittances of the color filters by using the spectrum simulation software. The ratio obtained by dividing the luminous flux of white light after passage through the color filter by the luminous flux of emitted light before passage through the color filter was calculated as a lumen maintenance factor (%). The results are shown in Table 3 below.

TABLE 3

|  | Total Amount of Phosphor (parts by mass) | First Phosphor | Second Phosphor | Third Phosphor | First Phosphor (mass %) | Vehicle Light-emitting Device Chromaticity Coordinates xL | Vehicle Light-emitting Device Chromaticity Coordinates yL | Color Filter | Vehicle Lighting Device Chromaticity Coordinates xW | Vehicle Lighting Device Chromaticity Coordinates yW | Δx | Δy | Lumen Maintenance Factor (%) |
|---|---|---|---|---|---|---|---|---|---|---|---|---|---|
| First Example | 89.0 | G-LAG | YAG | — | 87 | 0.292 | 0.347 | 1 | 0.324 | 0.329 | 0.032 | −0.018 | 64.0 |
| Second Example | 40.5 | β-SiAlON | YAG | — | 76 | 0.291 | 0.350 | 1 | 0.322 | 0.331 | 0.032 | −0.019 | 63.1 |
| Third Example | 23.3 | Chlorosilicate | YAG | — | 24 | 0.291 | 0.349 | 1 | 0.323 | 0.331 | 0.032 | −0.018 | 63.5 |
| Fourth Example | 167.5 | G-LAG | YAG | — | 96 | 0.269 | 0.367 | 2 | 0.322 | 0.329 | 0.053 | −0.038 | 46.9 |
| Fifth Example | 22.5 | Chlorosilicate | YAG | — | 44 | 0.270 | 0.371 | 2 | 0.324 | 0.333 | 0.053 | −0.038 | 45.8 |
| Sixth Example | — | Chlorosilicate | YAG | SCASN | — | 0.394 | 0.419 | 1 | 0.434 | 0.399 | 0.040 | −0.019 | 68.7 |
| Seventh Example | — | Chlorosilicate | YAG | — | — | 0.365 | 0.440 | 2 | 0.434 | 0.399 | 0.069 | −0.041 | 51.8 |
| First Comparative Example | 21.0 | Chlorosilicate | YAG | — | 93 | 0.223 | 0.424 | 3 | 0.322 | 0.335 | 0.098 | −0.090 | 19.1 |
| Second Comparative Example | — | Chlorosilicate | YAG | — | — | 0.292 | 0.501 | 3 | 0.434 | 0.339 | 0.142 | −0.102 | 22.3 |

Figure 10:
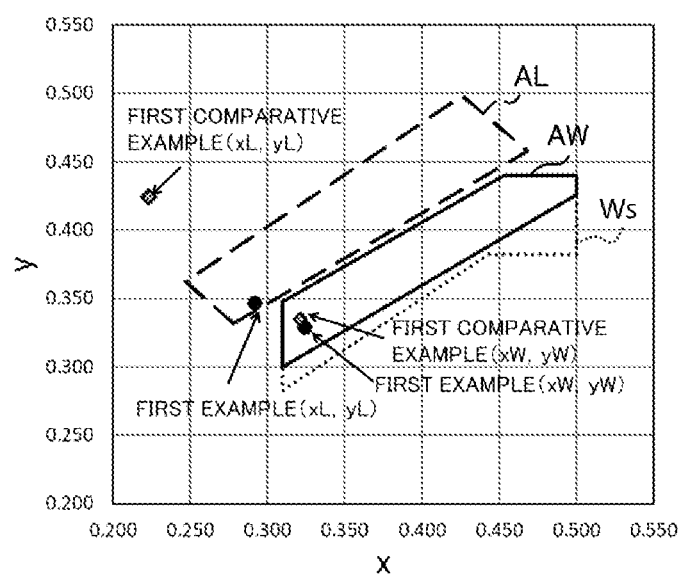
FIG. 10 shows chromaticity coordinates (xL, yL) of light emitted by a vehicle light-emitting device according to a first example before passage through a color filter, chromaticity coordinates (xW, yW) of white light of a vehicle lighting device after passage through the color filter, chromaticity coordinates (xL, yL) of light of a vehicle light-emitting device according to a first comparative example before passage through the color filter, and chromaticity coordinates (xW, yW) of white light of the vehicle lighting device after passage through the color filter in the CIE1931 chromaticity diagram.
Figure 11:
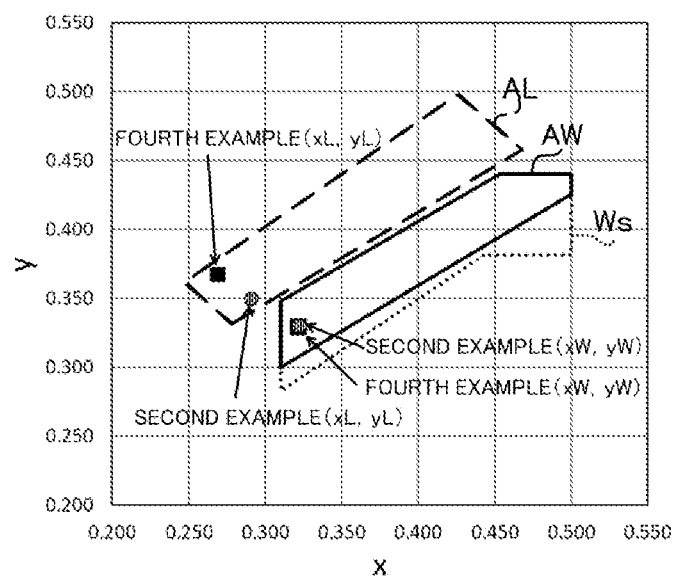
FIG. 11 shows chromaticity coordinates (xL, yL) of light of vehicle light-emitting devices according to second and fourth examples before passage through a color filter and chromaticity coordinates (xW, yW) of white light of a vehicle lighting device after passage through the color filter in the CIE1931 chromaticity diagram.
Figure 12:
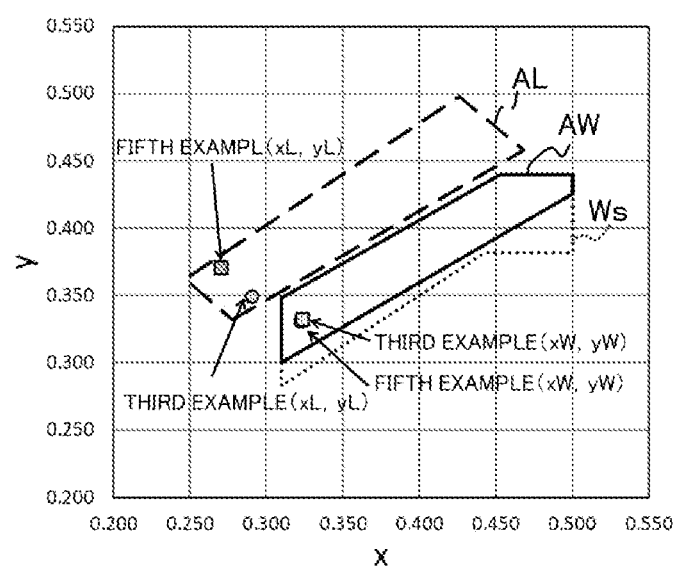
FIG. 12 shows chromaticity coordinates (xL, yL) of light of vehicle light-emitting devices according to third and fifth examples before passage through a color filter and chromaticity coordinates (xW, yW) of white light of a vehicle lighting device after passage through the color filter in the CIE1931 chromaticity diagram.
Figure 13:
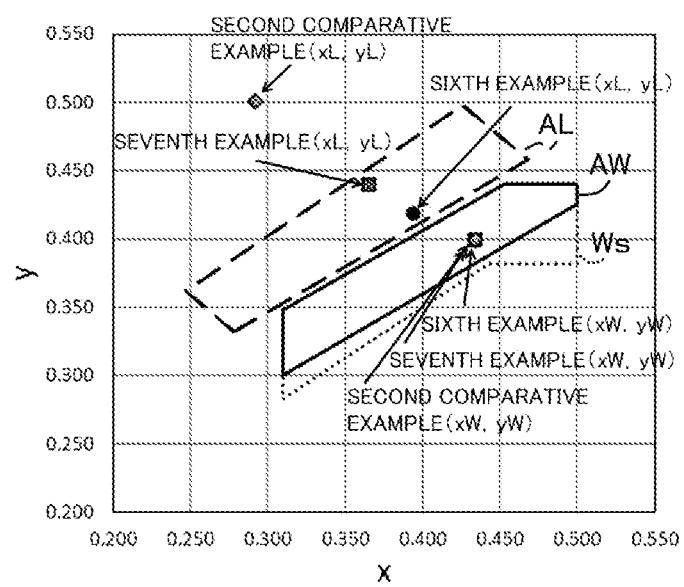
FIG. 13 shows chromaticity coordinates (xL, yL) of light of vehicle light-emitting devices according to sixth and seventh examples before passage through a color filter, chromaticity coordinates (xW, yW) of white light of a vehicle lighting device after passage through the color filter, chromaticity coordinates (xL, yL) of light of a vehicle light-emitting device according to a second comparative example before passage through a color filter, and chromaticity coordinates (xW, yW) of white light of the vehicle lighting device after passage through the color filter in the CIE1931 chromaticity diagram.

From the results shown in Table 3 and FIGS. 10 to 12, the vehicle light-emitting devices according to the first to fifth examples emitted light having chromaticity coordinates (xL, yL) in the region AL before passage through the color filter 1 or 2, and the vehicle lighting devices according to the first to fifth examples emitted, in simulation, white light having chromaticity coordinates (xW, yW) in the region AW after passage through the color filter 1 or 2. From the results shown in Table 3 and FIG. 13, the vehicle light-emitting devices according to the sixth and seventh examples emitted, in simulation, light having chromaticity coordinates (xL, yL) in the region AL before passage through the color filter 1 or 2, and the samples of the vehicle lighting devices according to the sixth and seventh examples emitted, in simulation, white light having chromaticity coordinates (xW, yW) in the region AW after passage through the color filter 1 or 2. For the first to seventh examples, the lumen maintenance factor of white light after passage through the color filter was 45% or more, and a decrease in the luminous flux was suppressed.

From the results shown in Table 3 and FIG. 10, the vehicle light-emitting device according to the first comparative example emitted light having chromaticity coordinates (xL, yL) in a range not included in the region AL before passage through the color filter 3, and the vehicle lighting device according to the first comparative example emitted light having chromaticity coordinates (xW, yW) included in the region AW by simulation after passage through the color filter 3. From the results shown in Table 3 and FIG. 13, the vehicle light-emitting device according to the second comparative example emitted light having chromaticity coordinates (xL, yL) in a range not included in the region AL by simulation before passage through the color filter 3, and the sample of the vehicle lighting device according to the second comparative example emitted light having chromaticity coordinates (xW, yW) included in the region AW by simulation after passage through the color filter 3. For the first and second comparative examples, the lumen maintenance factor of white light after passage through the color filter was less than 25%, and the luminous flux after passage through the color filter was decreased.

First-order straight lines representing linear-function relationships between Δx (or Δy) and xW (or yW) (in FIG. 14, etc.), were derived considering the minimum transmittance T for light in the range of 500 nm to 550 nm of the color filter 1 or 2 and differences Δx and Δy obtained by subtracting the chromaticity coordinates (xL, yL) of light emission before passage through the color filter from the chromaticity coordinates (xW, yW) of white light after passage through the color filter of the vehicle light-emitting devices and the vehicle lighting devices according to the first to seventh examples, and the ranges of the slopes and the intercepts were defined.

The minimum transmittance T for light in the range of 500 nm to 550 nm of the color filter 1 was set to 50%. The minimum transmittance T for light in the range of 500 nm to 550 nm of the color filter 2 was set to 30%.

Figure 14:
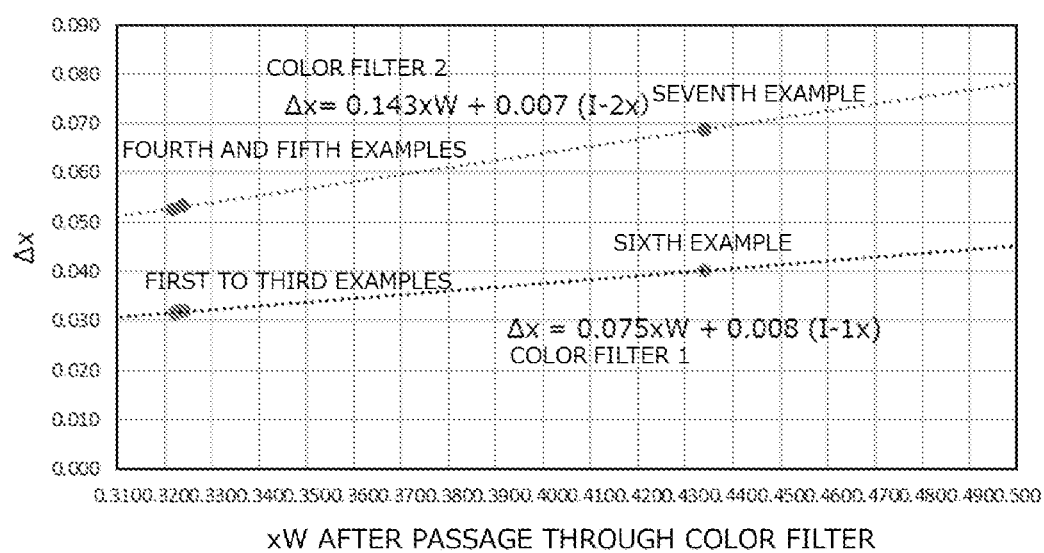
FIG. 14 is a diagram showing two first-order straight lines of color filters 1 and 2 obtained from an xL value and an xW value of the chromaticity of light emitted by the vehicle light-emitting devices and the vehicle lighting devices according to the first to seventh examples when a horizontal axis represents the xW value of chromaticity coordinates of chromaticity of white light of the vehicle lighting device after passage through the color filters and a vertical axis represents a difference $\Delta x$ obtained by subtracting the xL value of the chromaticity of light emitted by the vehicle light-emitting device before passage through the color filters from the xW value with respect to the first to seventh examples.

In the chromaticity diagram, the minimum xW value of the region AW is 0.310 and the maximum xW value of the region AW is 0.500. In a graph in which a horizontal axis represents the xW value after passage through the color filter in this range and a vertical axis represents the difference Δx obtained by subtracting the xL value of light emission before passage through the color filter from the xW value of white light after passage through the color filter, the xW values and Δx of the samples of the vehicle lighting devices according to the first, second, and sixth examples using the color filter 1 (minimum transmittance T: 50%) were plotted, and Formula (I-1x) below representing a first-order straight line in the case of using the color filter 1 was derived. In a graph in which a horizontal axis represents the xW value of the white light after passage through the color filter and a vertical axis represents Δx, the xW values and Δx of the samples of the vehicle lighting devices according to the fourth, fifth, and seventh examples using the color filter 2 (minimum transmittance T: 30%) were plotted, and Formula (I-2x) below representing a first-order straight line in the case of using the color filter 2 was derived. FIG. 14 is a graph in which a horizontal axis represents the xW value of the white light after passage through the color filter and a vertical axis represents Δx, and shows two first-order straight lines for the color filters 1 and 2 obtained from the light emission of the vehicle light-emitting devices and the white light of the vehicle lighting devices according to the first to seventh examples using the color filter 1 or 2.

$$\Delta x = 0.075 xW + 0.008 \quad \text{(I-1x)}$$

$$\Delta x = 0.143 xW + 0.007 \quad \text{(I-2x)}$$

It can be confirmed from Formula (I-1x) above representing the first-order straight line in the case of passage through the color filter 1 (minimum transmittance T: 50%) that Δx at a minimum value 0.310 of the x-coordinate in the region AW is approximately 0.030 and Δx at a maximum value 0.500 of the x-coordinate in the region AW is approximately 0.050. It can also be confirmed from Formula (I-2x) above representing the first-order straight line in the case of passage through the color filter 2 (minimum transmittance T: 30%) that Δx at a minimum value 0.310 of the x-coordinate in the region AW is approximately 0.050 and Δx at a maximum value 0.500 of the x-coordinate in the region AW is approximately 0.080.

Figure 15:
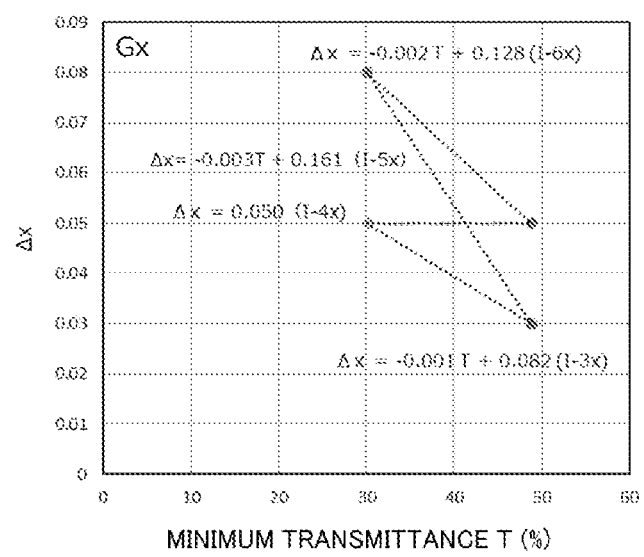
FIG. 15 is a graph Gx in which a horizontal axis represents a minimum transmittance T (%) for light in the range of 500 nm to 550 nm of the color filter and a vertical axis represents a difference $\Delta x$ obtained by subtracting the xL value of the light emitted by the vehicle light-emitting device before passage through the color filter from the xW value of the white light of the vehicle lighting device after passage through the color filter with respect to the first to seventh examples, and shows four first-order straight lines derived from four plotted points of maximum and minimum values of $\Delta x$ at the minimum transmittance T (%) of the color filter calculated from the formulas shown in FIG. 14.

In consideration of the minimum transmittance T for light in the range of 500 nm to 550 nm of the color filter, the following four Formulas (I-3x) to (I-6x) representing four first-order straight lines were derived in order to calculate the chromaticity coordinates of light emitted by the vehicle light-emitting device before passage through the color filter, from which white light with a high luminous flux is obtained after passage through the color filter. In a graph Gx in which a horizontal axis represents the minimum transmittance T (%) for light in the range of 500 nm to 550 nm of the color filter and a vertical axis represents the difference Δx obtained by subtracting the xL value of light emission before passage through the color filter from the xW value of white light after passage through the color filter, the value of Δx at the minimum value 0.310 of the x-coordinate in the region AW obtained from Formula (I-1x) above and Formula (I-2x) above and the value of Δx at the maximum value 0.500 of the x-coordinate in the region AW were plotted. From the four plotted points, Formulas (I-3x), (I-4x), (I-5x), and (I-6x) below representing four first-order straight lines were derived in consideration of the minimum transmittance T for light in the range of 500 nm to 550 nm of the color filter. FIG. 15 is the graph Gx in which the horizontal axis represents the minimum transmittance T (%) for light in the range of 500 nm to 550 nm of the color filter and the vertical axis represents Δx, and shows four first-order straight lines derived from four plotted points derived from Formulas (I-1x) and (I-2x) above.

$$\Delta x = -0.001T + 0.082 \quad \text{(I-3x)}$$

$$\Delta x = 0.050 \quad \text{(I-4x)}$$

$$\Delta x = -0.003T + 0.161 \quad \text{(I-5x)}$$

$$\Delta x = -0.002T + 0.128 \quad \text{(I-6x)}$$

When a slope is $S^1$ and an intercept is $I^1$ in Formulas (I-3x) to (I-6x) above, Formula (Ix) below can be derived. In Formulas (I-3x) to (I-6x) above, a minimum value of the slope $S^1$ is −0.003 and a maximum value of the slope $S^1$ is 0. In Formulas (I-3x) to (I-6x) above, a minimum value of the intercept h is 0.050 and a maximum value of the intercept $I^1$ is 0.161.

$$\Delta x = S^1 \times T + I^1 \quad \text{(Ix)}$$

In Formula (Ix) above, $S^1$ represents the slope, $I^1$ represents the intercept, T represents the minimum transmittance for light in the range of 500 nm to 550 nm of the color filter, and $S^1$, $I^1$, and T satisfy $-0.003 \leq S^1 \leq 0$, $0.050 \leq I^1 \leq 0.161$, and $20 < T \leq 70$, respectively. T may be in the range of 25 to 65 ($25 \leq T \leq 65$), in the range of 30 to 60 ($30 \leq T \leq 60$), in the range of 30 to 55 ($30 \leq T \leq 55$), or in the range of 30 to 50 ($30 \leq T \leq 50$). In Formula (Ix) above, Δx may be in the range of 0.025 to 0.085 ($0.025 \leq \Delta x \leq 0.085$).

Figure 16:
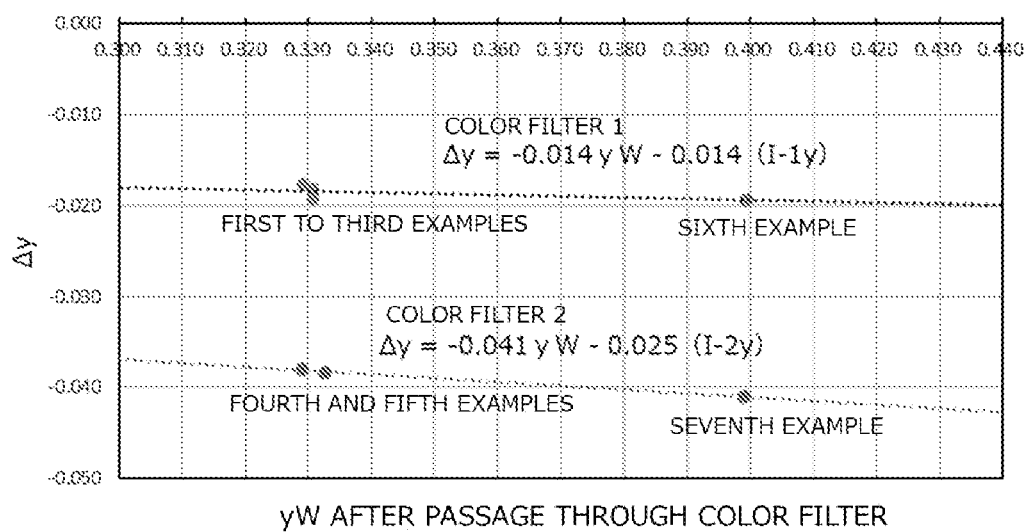
FIG. 16 is a diagram showing two first-order straight lines of the color filters 1 and 2 obtained from a yL value and a yW value of the chromaticity of light emitted by the vehicle light-emitting devices and the vehicle lighting devices according to the first to seventh examples when a horizontal axis represents the yW value of chromaticity coordinates of chromaticity of white light of the vehicle lighting device after passage through the color filter and a vertical axis represents a difference $\Delta y$ obtained by subtracting the yL value of the chromaticity of light emitted by the vehicle light-emitting device before passage through the color filter from the yW value with respect to the first to seventh examples.

In the chromaticity diagram, the minimum yW value in the region AW is 0.300 and the maximum yW value in the region AW is 0.440. The yW values of the samples of the vehicle lighting devices according to the first, second, and sixth examples using the color filter 1 (minimum transmittance T: 50%) were plotted in a graph in which a horizontal axis represents the yW value after passage through the color filter in the above range and a vertical axis represents the difference Δy obtained by subtracting the yL value of light emitted before passage through the color filter from the yW value of white light after passage through the color filter, and Formula (I-1y) below representing a first-order straight line in the case of using the color filter 1 was derived. The yW values of the samples of the vehicle lighting devices according to the fourth, fifth, and seventh examples using the color filter 2 (minimum transmittance T: 30%) were plotted in a graph in which a horizontal axis represents the yW value of white light after passage through the color filter and a vertical axis represents Δy, and Formula (I-2y) below representing a first-order straight line in the case of using the color filter 2 was derived. FIG. 16 is a graph in which a horizontal axis represents the yW value of the white light after passage through the color filter and a vertical axis represents Δy, and shows two first-order straight lines for the color filters 1 and 2 obtained from the light emission of the vehicle light-emitting devices and the vehicle lighting devices according to the first to seventh examples in the case of using the color filter 1 or 2.

$$\Delta y = -0.014 yW - 0.014 \quad \text{(I-1y)}$$

$$\Delta y = -0.041 yW - 0.025 \quad \text{(I-2y)}$$

It can be confirmed from Formula (I-1y) above representing the first-order straight line in the case of passage through the color filter 1 (minimum transmittance T: 50%) that Δy at a minimum value 0.300 of the y-coordinate in the region AW is approximately −0.010 and Δy at a maximum value 0.440 of the y-coordinate in the region AW is approximately −0.030. It can also be confirmed from Formula (I-2y) above representing the first-order straight line in the case of passage through the color filter 2 (minimum transmittance T: 30%) that Δy at a minimum value 0.300 of the y-coordinate in the region AW is approximately −0.030 and Δy at a maximum value 0.440 of the y-coordinate in the region AW is approximately −0.050.

Figure 17:
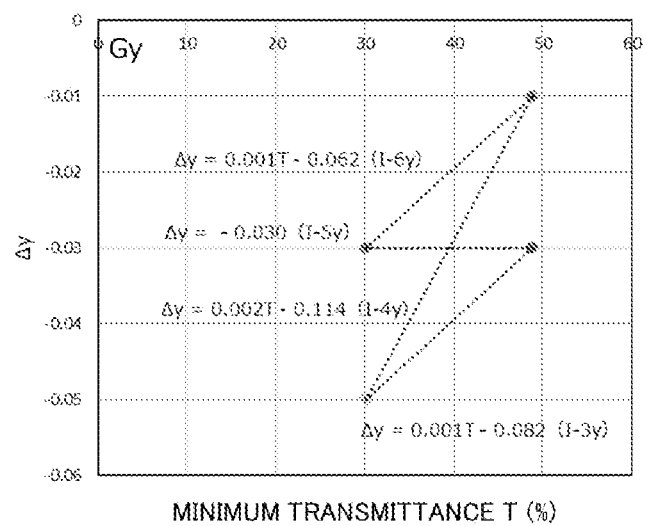
FIG. 17 is a graph Gy in which a horizontal axis represents a minimum transmittance T (%) for light in the range of 500 nm to 550 nm of the color filter and a vertical axis represents the difference $\Delta y$ obtained by subtracting the yL value of the chromaticity of the light emitted by the vehicle light-emitting device before passage through the color filter from the yW value of the chromaticity coordinates of the chromaticity of the white light of the vehicle lighting device after passage through the color filter with respect to the first to seventh examples, and shows four first-order straight lines derived from four plotted points of maximum and minimum values of Δy at the minimum transmittance T (%) of the color filter calculated from the formulas shown in FIG. 16.

In consideration of the minimum transmittance T for light in the range of 500 nm to 550 nm of the color filter, the following four Formulas (I-3y) to (I-6y) representing four first-order straight lines were derived in order to calculate the chromaticity coordinates of light emitted by the vehicle light-emitting device before passage through the color filter, from which white light with a high luminous flux is obtained after passage through the color filter. In a graph Gy in which a horizontal axis represents the minimum transmittance T (%) for light in the range of 500 nm to 550 nm of the color filter and a vertical axis represents the difference Δy obtained by subtracting the yL value of light emission before passage through the color filter from the yW value of white light after passage through the color filter, the value of Δy at the minimum value 0.300 of the y-coordinate in the region AW obtained from Formula (I-1y) above and Formula (I-2y) above and the value of Δy at the maximum value 0.440 of the y-coordinate in the region AW were plotted. From the four plotted points, Formulas (I-3y), (I-4y), (I-5y), and (I-6y) representing four first-order straight lines were derived in consideration of the minimum transmittance T for light in the range from 500 nm to 550 nm of the color filter. FIG. 17 is the graph Gy in which the horizontal axis represents the minimum transmittance T (%) for light in the range from 500 nm to 550 nm of the color filter and the vertical axis represents Δy, and shows four first-order straight lines derived by four plotted points derived from Formulas (I-1y) and (I-2y) above.

$$\Delta y = 0.001T - 0.082 \quad \text{(I-3y)}$$

$$\Delta y = 0.002T - 0.114 \quad \text{(I-4y)}$$

$$\Delta y = -0.030 \quad \text{(I-5y)}$$

$$\Delta y = 0.001T - 0.062 \quad \text{(I-6y)}$$

When a slope is $S^2$ and an intercept is $I^2$ in Formulas (I-3y) to (I-6y) above, Formula (Iy) below can be derived. In Formulas (I-3y) to (I-6y) above, a minimum value of the slope $S^2$ is 0 and a maximum value of the slope $S^2$ is 0.002. In Formulas (I-3y) to (I-6y) above, a minimum value of the intercept $I^2$ is −0.114 and a maximum value of the intercept $I^2$ is −0.030.

$$\Delta y = S^2 \times T + I^2 \quad \text{(Iy)}$$

In Formula (Iy) above, $S^2$ represents the slope, $I^2$ represents the intercept, T represents the minimum transmittance for light in the range of 500 nm to 550 nm of the color filter, and $S^2$, $I^2$, and T satisfy $0 \leq S^2 \leq 0.002$, $-0.114 \leq I^2 \leq -0.030$, and $20 < T \leq 70$, respectively. T may be in the range of 25 to 65 ($25 \leq T \leq 65$), in the range of 30 to 60 ($30 \leq T \leq 60$), in the range of 30 to 55 ($30 \leq T \leq 55$), or in the range of 30 to 50 ($30 \leq T \leq 50$). In Formula (Iy) above, Δy may be in the range of −0.055 to −0.005 ($-0.055 \leq \Delta y \leq -0.005$).

Δx and Δy derived from the chromaticity coordinates (xL, yL) of light emitted by the vehicle light-emitting devices according to the first to seventh examples and the chromaticity coordinates (xW, yW) of white light of the samples of the vehicle lighting devices according to the first to seventh examples and the minimum transmittances T (%) for light in the range of 500 nm to 550 nm of the color filters 1 and 2 were used to confirm whether the light emission of each of the first to seventh examples satisfies Formulas (Ix) and (Iy) above.

Figure 18:
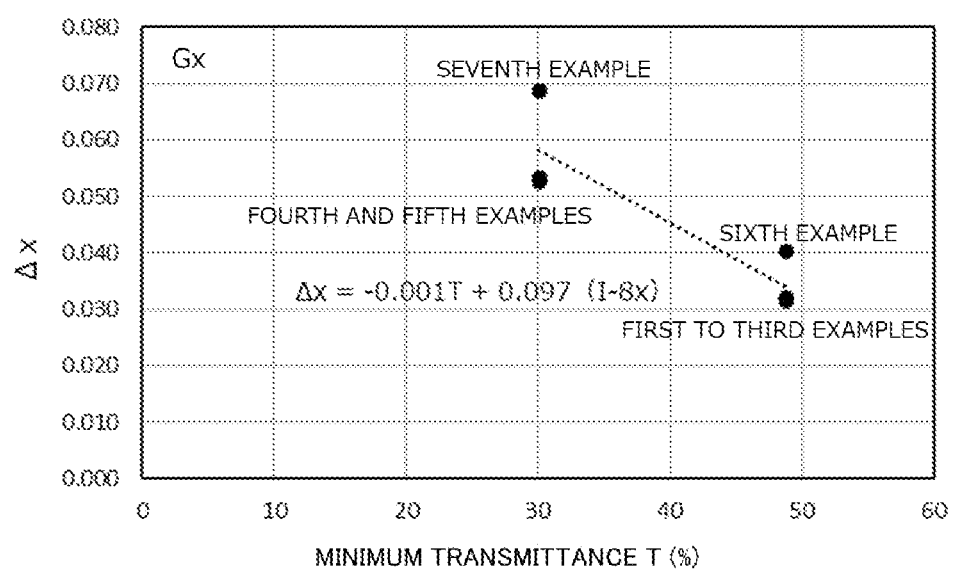
FIG. 18 is a graph Gx in which a horizontal axis represents a minimum transmittance T (%) for light in the range of 500 nm to 550 nm of the color filter and a vertical axis represents the difference Δx obtained by subtracting the xL value of the light emitted before passage through the color filter from the xW value of the white light after passage through the color filter, and shows an approximate first-order straight line derived from plotted points of the light emitted by the vehicle light-emitting devices and the vehicle lighting devices according to the first to seventh examples.

FIG. 18 is the graph Gx in which the horizontal axis represents the minimum transmittance T (%) for light in the range of 500 nm to 550 nm of the color filter and the vertical axis represents the difference Δx obtained by subtracting the xL value of the light emission before passage through the color filter from the xW value of the white light after passage through the color filter, and shows an approximate first-order straight line derived from plotted points of the light emission of the vehicle light-emitting devices and the samples of the vehicle lighting devices according to the first to seventh examples. In the graph Gx, the approximate first-order straight line derived from the light emission of the vehicle light-emitting devices according to the first to seventh examples and the white light of the samples of the vehicle lighting devices according to the first to seventh examples is represented by Formula (I-8x) below.

$$\Delta x = -0.001T + 0.097 \quad \text{(I-8x)}$$

In the graph Gx, Formula (I-8x) above representing the approximate first-order straight line derived from the light emission of the vehicle light-emitting device according to the first to seventh examples and the white light of the samples of the vehicle lighting devices according to the first to seventh examples has a slope $S^1$ of −0.001 and an intercept $I^1$ of 0.097. The Formula (I-8x) above satisfies the range from −0.003 to 0 of the slope $S^1$ in Formula (Ix) ($-0.003 \leq S^1 \leq 0$), the range from 0.050 to 0.161 of the intercept $I^1$ ($0.050 \leq I^1 \leq 0.161$), and Formula (Ix).

Figure 19:
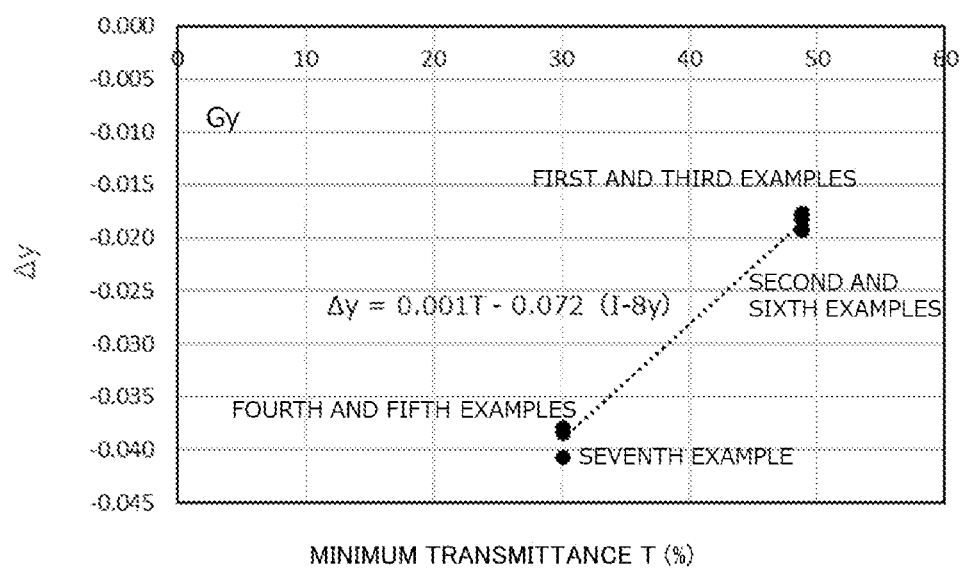
FIG. 19 is a graph Gy in which a horizontal axis represents a minimum transmittance T (%) for light in the range of 500 nm to 550 nm of the color filter and a vertical axis represents the difference Δy obtained by subtracting the yL value of the light emitted before passage through the color filter from the yW value of the white light after passage through the color filter, and shows an approximate first-order straight line derived from plotted points of the light emitted by the vehicle light-emitting devices and samples of the vehicle lighting devices according to the first to seventh examples.

FIG. 19 is the graph Gy in which the horizontal axis represents the minimum transmittance T (%) for light in the range of 500 nm to 550 nm of the color filter and the vertical axis represents the difference Δy obtained by subtracting the yL value of the light emission before passage through the color filter from the yW value of the white light after passage through the color filter, and shows an approximate first-order straight line derived from plotted points of the light emission of the vehicle light-emitting devices and the samples of the vehicle lighting devices according to the first to seventh examples. In the graph Gy, the approximate first-order straight line derived from the light emission of the vehicle light-emitting devices according to the first to seventh examples and the white light of the samples of the vehicle lighting devices according to the first to seventh examples is represented by Formula (I-8y) below.

$$\Delta y = 0.001T - 0.072 \quad \text{(I-8y)}$$

In the graph Gy, Formula (I-8y) above representing the approximate first-order straight line derived from the light emission of the vehicle light-emitting devices according to the first to seventh examples and the white light of the samples of the vehicle lighting devices according to the first to seventh examples has a slope $S^2$ of 0.001 and an intercept $I^2$ of −0.072. Formula (I-8y) satisfies the range from 0 to 0.002 of the slope $S^2$ in the Formula (Iy) ($0 \leq S^2 \leq 0.002$), the range from −0.114 to −0.030 of the intercept $I^2$ ($-0.114 \leq I^2 \leq -0.030$), and Formula (Iy).

The vehicle light-emitting devices and the samples of the vehicle lighting devices according to the first to seventh examples satisfy Formula (Ix) and Formula (Iy), so that white light in the white region Ws defined by JIS D5500 or ECE with less decrease in the luminous flux is emitted after passage through the color filter, and thus prescribed white light can be emitted using one color filter. Accordingly, it is possible to improve the degree of freedom in design of a vehicle lighting device that can be used as a rear combination lamp for a vehicle body.

The vehicle light-emitting devices according to certain embodiments of the present disclosure can be used for a vehicle lighting device. The vehicle lighting device can be used for a rear combination lamp of a vehicle used for a road transport vehicle such as a motorcycle or an automatic four-wheeled vehicle, a railway vehicle, or a vehicle-based construction machine such as a tractor-based construction machine such as a land-leveling, transporting, or loading machine or a shovel-based construction machine such as an excavator machine.

What is claimed is:
1. A vehicle light-emitting device comprising:
   a light-emitting element having a peak emission wavelength of 400 nm or greater and 510 nm or less; and
   a fluorescent member containing a first phosphor excited by light emitted by the light-emitting element and emitting light having a peak emission wavelength of

480 nm or greater and 530 nm or less and a second phosphor excited by the light emitted by the light-emitting element and emitting light having a peak emission wavelength of 540 nm or greater and 600 nm or less, wherein the vehicle light-emitting device is configured to emit light having chromaticity existing in a region AL in a CIE 1931 chromaticity diagram in which chromaticity is defined by x and y coordinates, the region AL defined by a first L straight line connecting a first L point at first chromaticity coordinates (xL=0.278, yL=0.332) and a second L point at second chromaticity coordinates (xL=0.468, yL=0.458), a second L straight line connecting the second L point and a third L point at third chromaticity coordinates (xL=0.426, yL=0.498), a third L straight line connecting the third L point and a fourth L point at fourth chromaticity coordinates (xL=0.247, yL=0.362), and a fourth L straight line connecting the fourth L point and the first L point.

2. The vehicle light-emitting device according to claim 1, wherein the first phosphor contains at least one phosphor selected from the group consisting of a silicate phosphor having a composition represented by Formula (1a) below, a first rare earth aluminate phosphor having a composition represented by Formula (1b) below, and a βSiAlON phosphor having a composition represented by Formula (1c) below:

$$(Ca,Sr,Ba)_8MgSi_4O_{16}(F,Cl,Br)_2:Eu \quad (1a)$$

$$(Lu,Y,Gd,Tb)_3(Al,Ga)_5O_{12}:Ce \quad (1b)$$

$$Si_{6-z}Al_zO_zN_{8-z}:Eu(0<z\leq4.2) \quad (1c).$$

3. The vehicle light-emitting device according to claim 1, wherein the second phosphor contains a second rare earth aluminate phosphor having a composition represented by Formula (2a) below:

$$(Y,Gd,Tb)_3Al_5O_{12}:Ce \quad (2a).$$

4. The vehicle light-emitting device according to claim 1, wherein the fluorescent member contains a third phosphor excited by the light emitted by the light-emitting element and emitting light having a peak emission wavelength of 605 nm or greater and 670 nm or less.

5. The vehicle light-emitting device according to claim 4, wherein the third phosphor contains at least one phosphor selected from the group consisting of a first nitride phosphor having a composition represented by Formula (3a) below and a second nitride phosphor having a composition represented by Formula (3b) below:

$$(Sr,Ca)AlSiN_3:Eu \quad (3a)$$

$$(Ba,Sr)_2Si_5N_8:Eu \quad (3b).$$

6. A vehicle lighting device comprising:
the vehicle light-emitting device according to claim 1; and
a color filter at a position on which light emitted by the vehicle light-emitting device is incident, wherein
a maximum transmittance of the color filter for light in a range of 410 nm to 480 nm is more than 50% and 90% or less,
a minimum transmittance of the color filter for light in a range of 500 nm to 550 nm is more than 20% and 70% or less,
a transmittance of the color filter for light in a range from 600 nm to 730 nm is 80% or more, and
the vehicle lighting device is configured such that the light emitted by the vehicle light-emitting device is transmitted through the color filter to emit white light.

7. The vehicle lighting device according to claim 6, wherein the vehicle light-emitting device is configured to emit white light having chromaticity existing in a region AW in a CIE 1931 chromaticity diagram in which chromaticity is defined by x and y coordinates, the region AW defined by a first W straight line connecting a first W point at first chromaticity coordinates (xW=0.310, yW=0.300) and a second W point at second chromaticity coordinates (xW=0.500, yW=0.426), a second W straight line connecting the second W point and a third W point at third chromaticity coordinates (xW=0.500, yW=0.440), a third W straight line connecting the third W point and a fourth W point at fourth chromaticity coordinates (xW=0.453, yW=0.440), and a fourth W straight line connecting the fourth W point and a fifth W point at fifth chromaticity coordinates (xW=0.310, yW=0.348), and a fifth W straight line connecting the fifth W point and the first W point.

8. The vehicle lighting device according to claim 6, wherein a ratio of a luminous flux of the white light after passage through the color filter to a luminous flux of the light emitted by the vehicle light-emitting device before passage through the color filter is 40% or greater and 75% or less.

9. The vehicle lighting device according to claim 6, wherein
in a graph Gx in which a horizontal axis represents the minimum transmittance T (%) for light in the range of 500 nm to 550 nm of the color filter and a vertical axis represents Δx, wherein Δx is a difference obtained by subtracting an xL value, which is an x-coordinate of the chromaticity coordinates of the light emitted by the vehicle light-emitting device before passage through the color filter in the CIE1931 chromaticity diagram, from an xW value, which is an x-coordinate of the chromaticity coordinates of the white light after passage through the color filter in the CIE1931 chromaticity diagram, Δx satisfies Formula (Ix) below, and
in a graph Gy in which a horizontal axis represents the minimum transmittance T (%) for the light in the range of 500 nm to 550 nm of the color filter and a vertical axis represents Δy, wherein Δy is a difference obtained by subtracting an yL value, which is an y-coordinate of the chromaticity coordinates of the light emitted by the vehicle light-emitting device before passage through the color filter in the CIE1931 chromaticity diagram, from an yW value, which is an y-coordinate of the chromaticity coordinates of the white light after passage through the color filter in the CIE1931 chromaticity diagram, Δy satisfies Formula (Iy) below:

$$\Delta x = S^1 \times T + I^1 \quad (Ix)$$

(in the graph Gx, in Formula (Ix), $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively)

$$\Delta y = S^2 \times T + I^2 \quad (Iy)$$

(in the graph Gy, in Formula (Iy), $S^2$ represents a slope, $I^2$ represents an intercept, and $S^2$, $I^2$ and T satisfy $0 \leq S^2 \leq 0.002$, $-0.114 \leq I^2 \leq -0.030$, and $20 < T \leq 70$, respectively).

10. The vehicle lighting device according to claim 9, wherein in Formula (Ix), Δx is 0.025 or greater and 0.085 or less and in Formula (Iy), Δy is −0.055 or greater and −0.005 or less.

11. A vehicle lighting device, comprising:

the vehicle light-emitting device according to claim 1; and a color filter configured to transmit light emitted by the vehicle light-emitting device to emit white light, wherein in a graph Gx in which a horizontal axis represents a minimum transmittance T (%) of the color filter for light in the range of 500 nm to 550 nm and a vertical axis represents Δx, wherein Δx is a difference obtained by subtracting an xL value, which is an x-coordinate of the chromaticity coordinates of the light emitted by the vehicle light-emitting device before passage through the color filter in the CIE1931 chromaticity diagram, from an xW value, which is an x-coordinate of the chromaticity coordinates of the white light after passage through the color filter in the CIE1931 chromaticity diagram, Δx satisfies Formula (Ix) below, and in a graph Gy in which a horizontal axis represents the minimum transmittance T (%) of the color filter for the light in the range of 500 nm to 550 nm and a vertical axis represents Δy, wherein Δy is a difference obtained by subtracting an yL value, which is an y-coordinate of the chromaticity coordinates of the light emitted by the vehicle light-emitting device before passage through the color filter in the CIE1931 chromaticity diagram, from an yW value, which is an y-coordinate of the chromaticity coordinates of the white light after passage through the color filter in the CIE1931 chromaticity diagram, Δy satisfies Formula (Iy) below:

$$\Delta x = S^1 \times T + I^1 \tag{Ix}$$

wherein $S^1$ represents a slope, $I^1$ represents an intercept, and $S^1$, $I^1$, and T satisfy $-0.003 \leq S^1 \leq 0$, $0.050 \leq I^1 \leq 0.161$, and $20 < T \leq 70$, respectively, $$\Delta y = S^2 \times T + I^2 \tag{Iy}$$

wherein $S^2$ represents a slope, $I^2$ represents an intercept, and $S^2$, $I^2$, and T satisfy $0 \leq S^2 \leq 0.002$, $-0.114 \leq I^2 \leq -0.030$, and $20 < T \leq 70$, respectively.

12. The vehicle lighting device according to claim 11, wherein in Formula (Ix), Δx is 0.025 or greater and 0.085 or less and in Formula (Iy), Δy is −0.055 or greater and −0.005 or less.

* * * * *